United States Patent
Ellinger et al.

(10) Patent No.: US 9,786,426 B2
(45) Date of Patent: Oct. 10, 2017

(54) COMPONENT ARRANGEMENT

(71) Applicant: Technische Universitat Dresden, Dresden (DE)

(72) Inventors: Frank Ellinger, Dresden (DE); Ronny Henker, Dresden (DE); Guido Belfiore, Dresden (DE); Christian Thiele, Dresden (DE)

(73) Assignee: Technische Universitat Dresden (DE)

( * ) Notice: Subject to any disclaimer, the term of this patent is extended or adjusted under 35 U.S.C. 154(b) by 38 days.

(21) Appl. No.: 14/899,862

(22) PCT Filed: Jun. 25, 2014

(86) PCT No.: PCT/EP2014/063421
§ 371 (c)(1),
(2) Date: Dec. 18, 2015

(87) PCT Pub. No.: WO2014/207051
PCT Pub. Date: Dec. 31, 2014

(65) Prior Publication Data
US 2016/0141092 A1 May 19, 2016

(30) Foreign Application Priority Data
Jun. 26, 2013 (DE) .................. 10 2013 106 693

(51) Int. Cl.
*H01F 27/28* (2006.01)
*H01F 5/00* (2006.01)
(Continued)

(52) U.S. Cl.
CPC ........... *H01F 27/2804* (2013.01); *H01F 5/00* (2013.01); *H01F 17/0013* (2013.01);
(Continued)

(58) Field of Classification Search
CPC .................. H01F 5/00; H01F 27/00–27/30
(Continued)

(56) References Cited

U.S. PATENT DOCUMENTS 6,037,649 A * 3/2000 Liou ................... H01L 23/5227
257/531
8,068,004 B1 * 11/2011 Chong ................ H01F 17/0013
29/602.1
(Continued)

OTHER PUBLICATIONS

Chen, J, et al, OnChip Spiral Inductors for RF Applications: An Overview, Journal of Semiconductor Technology and Science, vol. 4. No. 3, Sep. 2004, pp. 149-167.
(Continued)

*Primary Examiner* — Tuyen Nguyen
(74) *Attorney, Agent, or Firm* — Barnes & Thornburg LLP; Jeffrey R. Stone

(57) ABSTRACT

Various embodiments may relate to a component arrangement, including a carrier, wherein at least one electronic component is formed in the carrier, a first metallization layer over the carrier, wherein the first metallization layer has a first metallic coupling structure, which is electrically coupled to the at least one electronic component, a second metallization layer over the first metallization layer, wherein the second metallization layer has a second metallic coupling structure, wherein the first metallic coupling structure is coupled to the second metallic coupling structure by means of at least one via, and a plurality of additional vias, which extend at least between the first metallization layer and the second metallization layer and are electrically conductively coupled to one another in such a way that they form a coil, which has a coil region which is at an angle to the main processing surface of the carrier.

20 Claims, 13 Drawing Sheets

(51) Int. Cl.
*H01F 17/00* (2006.01)
*H01L 23/522* (2006.01)

(52) U.S. Cl.
CPC .... *H01L 23/5227* (2013.01); *H01F 2017/002* (2013.01); *H01F 2027/2809* (2013.01); *H01L 2224/16145* (2013.01); *H01L 2924/0002* (2013.01)

(58) Field of Classification Search
USPC .................................. 336/65, 83, 200, 232
See application file for complete search history.

(56) References Cited

U.S. PATENT DOCUMENTS

| | | | | |
|---|---|---|---|---|
| 9,196,406 | B2* | 11/2015 | Leipold | ............... H01F 5/003 |
| 9,373,434 | B2* | 6/2016 | Yen | |
| 2010/0225400 | A1 | 9/2010 | Rofougaran et al. | |
| 2010/0289118 | A1 | 11/2010 | Kokubun | |
| 2012/0268229 | A1 | 10/2012 | Yen et al. | |
| 2013/0044455 | A1* | 2/2013 | Cho | ............... H01L 23/5223 361/816 |
| 2013/0093045 | A1* | 4/2013 | Cho | ............... H01L 23/5223 257/531 |
| 2013/0099352 | A1* | 4/2013 | Yen | ............... H01L 23/5225 257/531 |
| 2013/0113448 | A1 | 5/2013 | Shapiro et al. | |

OTHER PUBLICATIONS

Tsui, Hau-Yiu, et al., An On-Chip Vertical Solenoid Inductor Design for Multigigahertz CMOS RFIC, IEEE Transactions on Microwave Theory and techniques, vol. 53, No. 6, Jun. 2005, pp. 1883-1890.
Yousef, K., et al., Design of 3D Integrated Inductors for RFICs, 2012 Japan-Egypt Conference on Electronics, Communications and Computers, pp. 22-25.

* cited by examiner

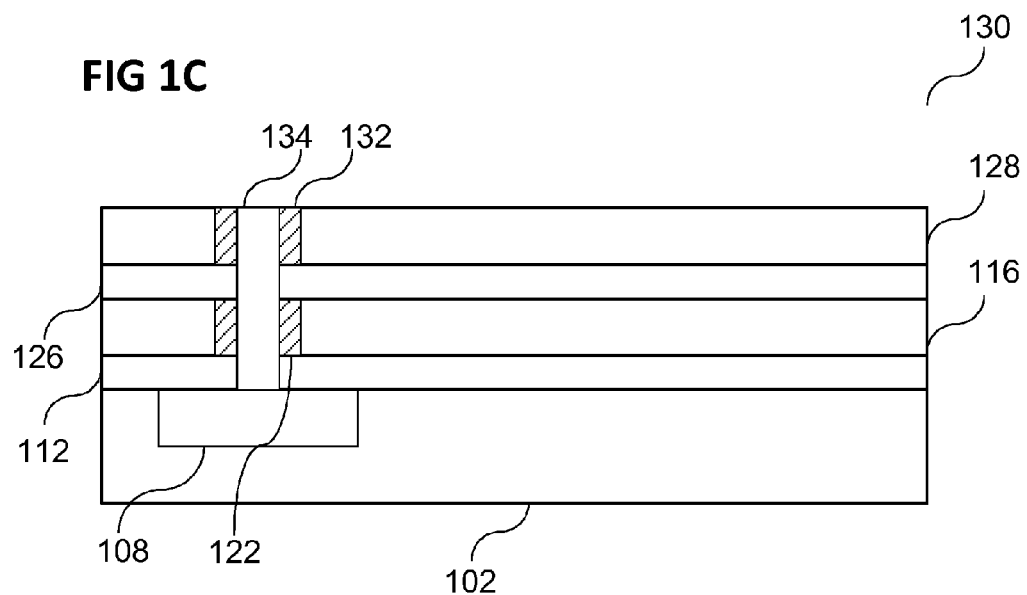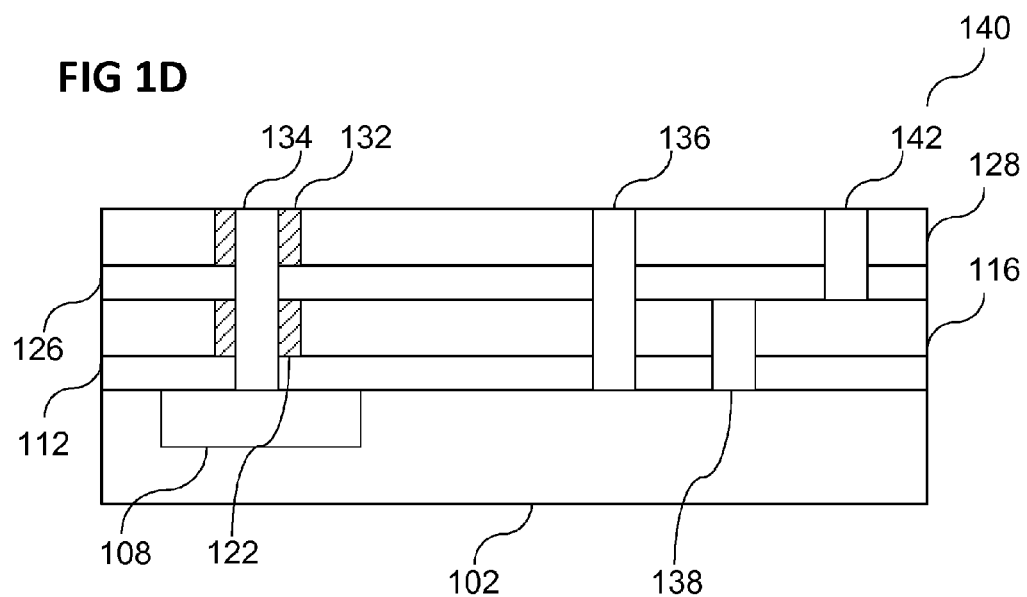

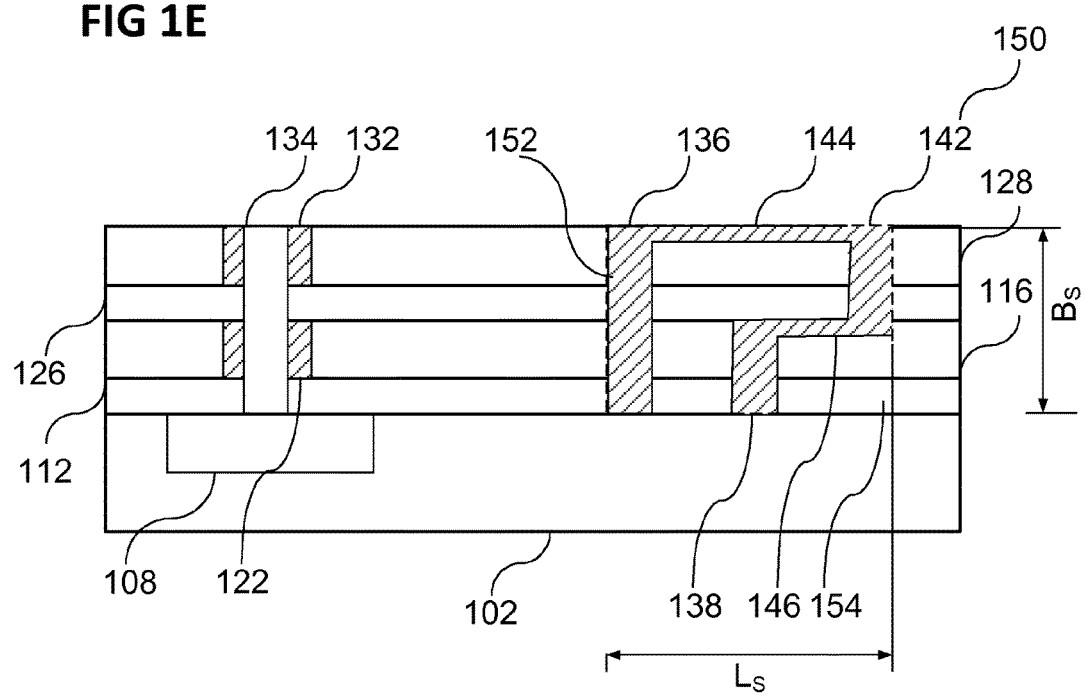

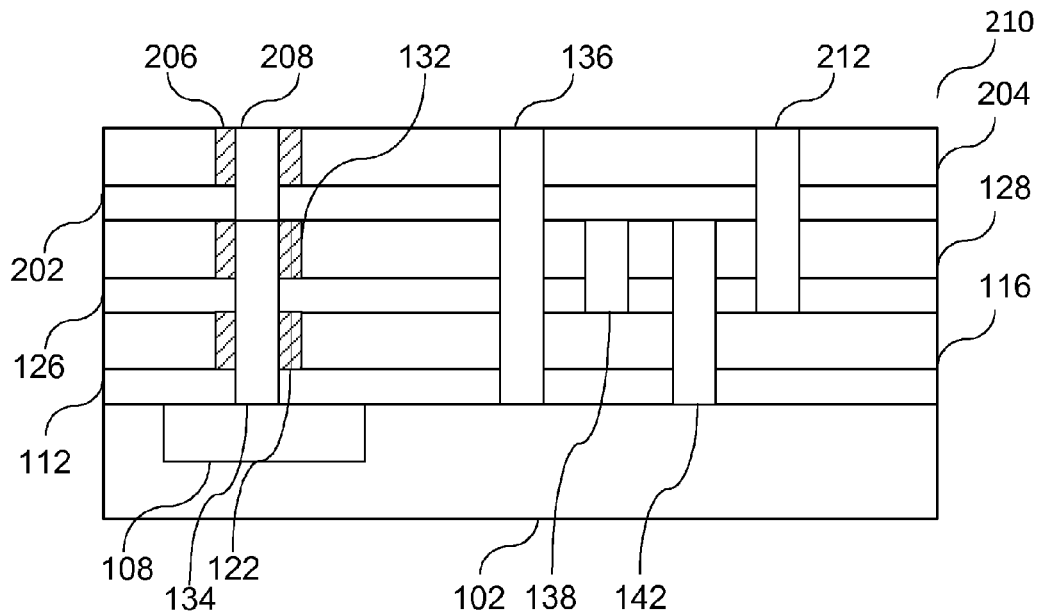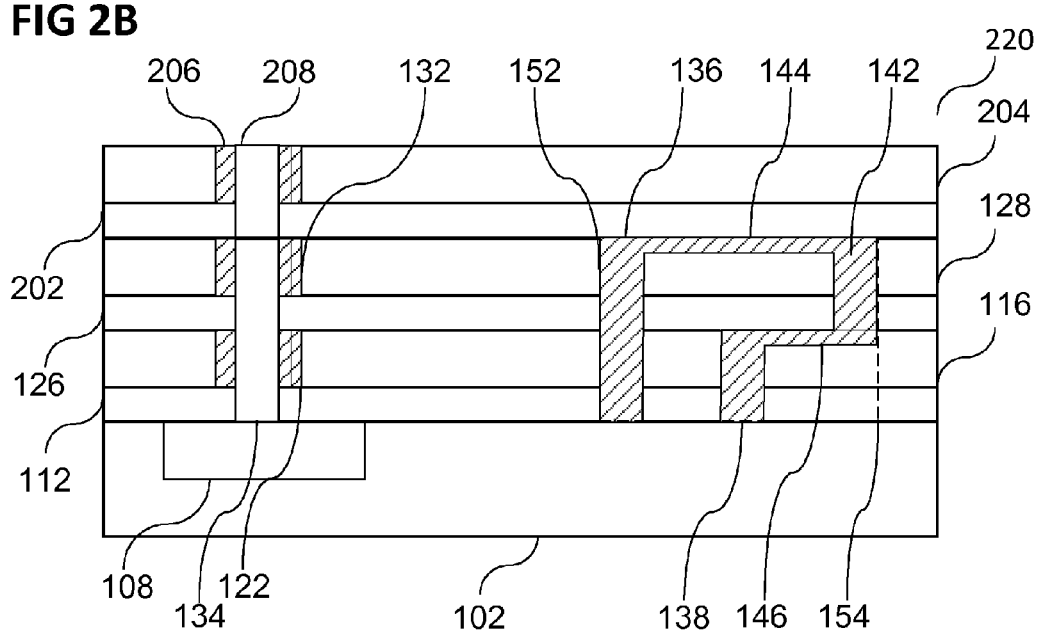

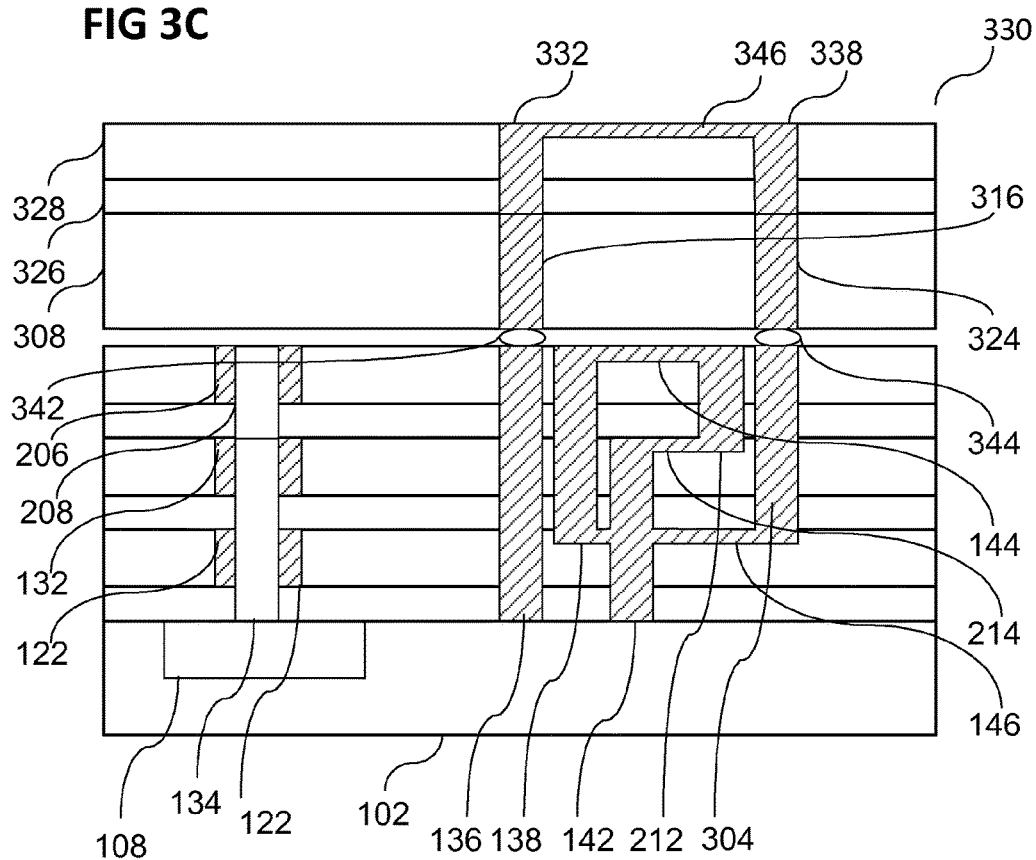

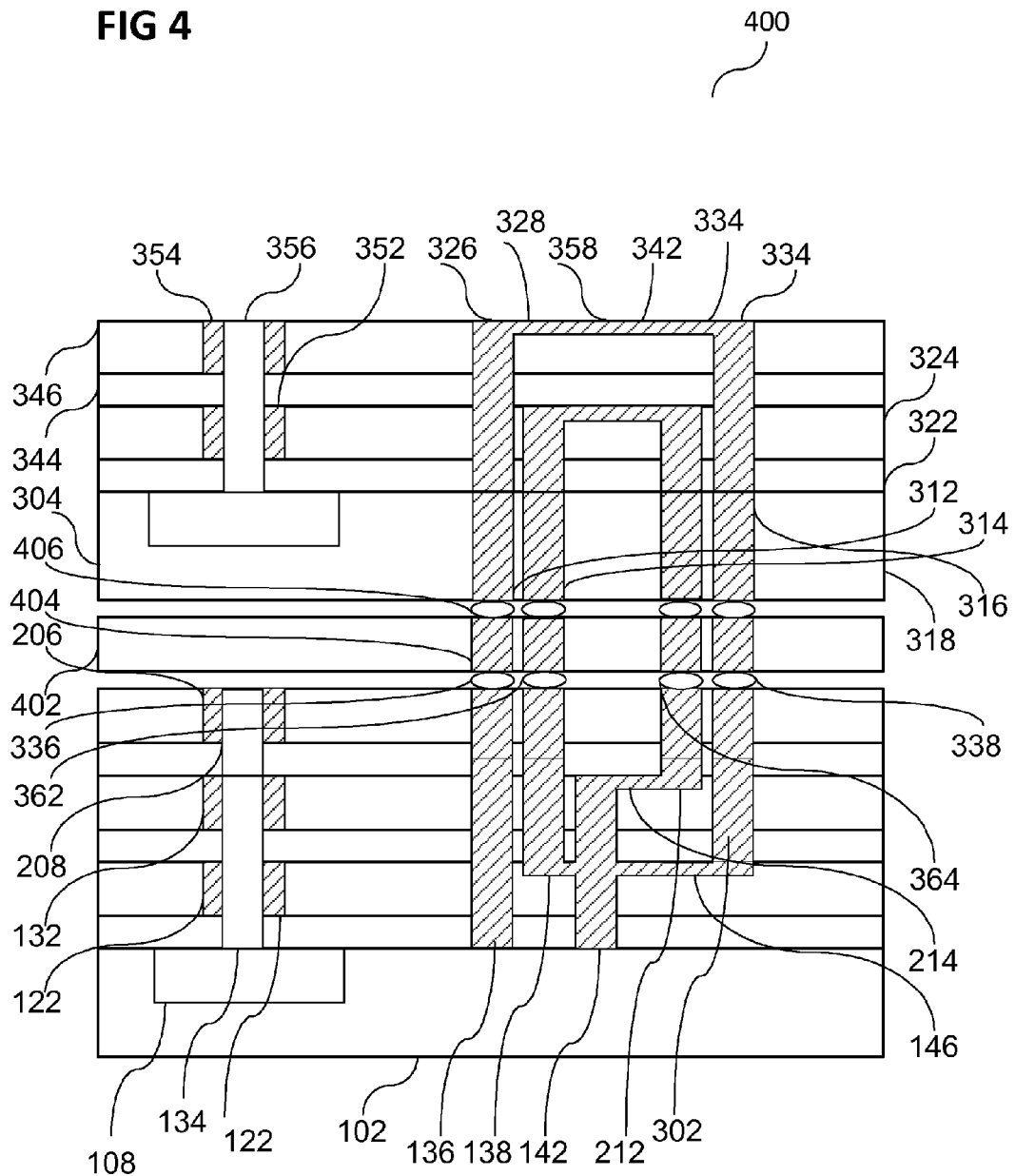

COMPONENT ARRANGEMENT

RELATED APPLICATIONS

The present application is a national stage entry according to 35 U.S.C. §371 of PCT application No. PCT/EP2014/063421 filed on Jun. 26, 2014 which claims priority from German application No. 10 2013 106 693.3 filed on Jun. 26, 2013, and is incorporated herein by reference in its entirety.

TECHNICAL FIELD

Various embodiments relate to a component arrangement.

BACKGROUND

In order to realize an electrical or an electronic circuit, passive components are required besides active components, such as e.g. transistors. One of the most important passive components, besides resistors and capacitors, is a coil. A coil generally consists of wound or spiral conductor loops. The properties, for example the inductance, of the coil are usually crucially dependent on the materials used, the number of turns (coil turns, coil windings) and the physical dimensions, such as the diameter of the conductor, the size of the coil, etc. A coil is often used in a frequency-determined or -determining circuit such as e.g. an oscillator or a filter, and in a circuit for current smoothing or in a power supply unit. In a radio-frequency/broadband amplifier circuit, a coil is predominantly employed for improving the amplifier characteristic, i.e. for increasing the bandwidth and/or for smoothing the amplitude response, and for improving the input/output matching.

In the course of miniaturization and in present-day microelectronics, the electronic components are integrated by semiconductor technology and form a chip, which in turn constitutes a complex electronic component having a new function. In this case, the individual elements of the microelectronic circuits are produced on a semiconductor substrate, the so-called wafer, by corresponding doping/alloying and by targeted application of functional metal layers (also referred to hereinafter as metal plies or metal planes or metallization planes or metallization layers). This gives rise to a structure of a plurality of horizontal metal layers (also referred to as a metal stack, which is dependent on the respective technology specification) which are electrically insulated from one another and can be connected to one another by vias (known as vertical interconnect access, vias; also referred to hereinafter as contact feedthroughs, interlevel connection); in a manner similar to that in the case of a multilayered printed circuit board. The designation of the orientation as horizontal is defined here by the plane/position of the semiconductor substrate. The individual metal plies are thus arranged parallel to one another and parallel to the substrate; that is to say are situated in the horizontal plane. A vertical orientation thus designates a plane which is situated perpendicularly to the substrate and to the individual metal plies.

If a coil is integrated in such a semiconductor technology, then this is usually done nowadays on a horizontal metal plane by conductor tracks with a specific width being arranged in a spiral fashion. As a result of this horizontal arrangement, the coil occupies a very large area and not uncommonly is larger than the remaining part of the circuit. Since the costs in the semiconductor industry are calculated with regard to the chip area used, the coil thus constitutes the largest cost factor in such a circuit.

Hitherto a coil and thus the coil turns have been integrated in the horizontal plane of a chip [Chen, J. & Liou, J. J., On-Chip Spiral Inductors for RF Applications: An overview, J. Semiconductor Techn. Sci. 4, 149 (2004)]. For this purpose, a metallic strip conductor having a specific width is arranged in a spiral fashion on a metal ply in the metal stack. This is carried out on one of the upper metal plies of the metal stack. One connection of the coil is then led from the outer edge of the conductor strip spiral as connection toward the outside. Since strip conductors are not permitted to cross one another on the metal ply, the second connection of the coil is led from the interior of the spiral by way of a via to a higher or lower metal ply in the metal stack and the connection is established from there.

Furthermore, there are also coils which, although referred to as vertical coils, do not exclusively use the vertical plane or lie in a planar fashion in the vertical plane. Rather, although in such an arrangement the strip conductor is led from one metal plane to the next, the actual coil turns lie in the horizontal plane, as a result of which the coil region defined by the coil turns lies in the horizontal plane and thus parallel to the main processing surface of the substrate. This gives rise for example to a coil in the form of a cylindrical coil [Tsui, H.-Y. et. Al., An On-Chip Vertical Solenoid Inductor Design for Multigigahertz CMOS RFIC, IEE Transactions on Microwave Theory and Technique 53, 1883 (2005)]. Furthermore, coils can be connected to one another or cascaded with one another. These arrangements are known as stacked integrated coils [Yousef, K. et al., Design of 3D Integrated Inductors for RFICs, Japan-Egypt Conf. on Electronics, Communications and Computers (JEC-ECC), 22 (2012)]. Furthermore, there are helical arrangements in which individual vertical conductor loops are horizontally connected to one another [US 2012/0268229 A1].

SUMMARY

Various embodiments provide a coil having a reduced area requirement.

Various embodiments provide a coil using the metallization layers of the component arrangement and the vias thereof, wherein the metallization layers and the vias thereof are electrically conductively connected to one another with the aid of electrically conductive conduction structures in such a way that they form a coil having a reduced area requirement, said coil including a coil region situated at an angle with respect to the main processing surface of the carrier of the component arrangement, wherein the coil region is situated substantially perpendicularly to the main processing plane of the carrier. In this case, the angle, formed between the coil region and the main processing plane, is in a range of from greater than 0° to 90°. Providing a coil having a reduced area requirement, the coil region of which is situated at an angle in the range of greater than 0° to 90° with respect to the main processing plane of the carrier, results in a reduction of the required chip area and of the chip and material costs associated therewith. For realizing the electrically conductive conduction structures, which electrically conductively connect different metallization layers of the component arrangement and the via thereof in such a way that they form a coil, it is possible to use the materials and methods used in the conventional production process for realizing the metallization layers, the metallic coupling structures and the filling of the vias. This enables an integration of the coil, provided by the present disclosure, having a reduced area requirement into the conventional production process and a cost saving associated therewith.

Moreover, the component arrangement provided in the present disclosure enables the realization of coils having a reduced area requirement also in the 3D integration of a plurality of chips with the additional use of the silicon vias or the use of the interposer vias in the context of the production process of the 3D chip integration.

Various embodiments provide a component arrangement, wherein the structure of the component arrangement includes the following features: a carrier, wherein at least one electronic component is formed in the carrier; a first metallization layer above the carrier, wherein the first metallization layer includes a first metallic coupling structure, which is electronically coupled to the at least one electronic component; a second metallization layer above the first metallization layer, wherein the second metallization layer includes a second metallic coupling structure, wherein the first metallic coupling structure is coupled to the second metallic coupling structure by at least one via; and a plurality of additional vias, which extend at least between the first metallization layer and the second metallization layer and which are electrically conductively coupled to one another in such a way that they form a coil including a coil region situated at an angle with respect to the main processing surface of the carrier.

In one configuration, the component arrangement includes a carrier, e.g. a substrate, e.g. a semiconductor substrate.

In another configuration, the carrier includes at least one electronic component from the following group of electronic components or is designed as such: resistor, diode, transistor, capacitor, coil, thyristor, solar cell, electro-optical component, micromechanical component.

In one configuration, the component arrangement includes a first metallization layer, which is arranged directly above the carrier including the at least one integrated component, wherein the first metallization layer may include or can consist of at least one of the following materials: aluminum (Al) and copper (Cu) or an alloy of the metals mentioned.

In another configuration, the component arrangement includes a first metallic coupling structure, e.g. a metal conductor track (metal-containing conductor track, conductive track, conduction track), e.g. a low-resistance metallic conductor track, formed in the first metallization layer, which realizes the electrical use within the metallization layer, as a metal conductor track of high electrical conductivity. The first metallic coupling structure is electrically conductively coupled to the at least one electronic component.

It should be pointed out in this connection that, in various embodiments (for example depending on the technologies respectively used), provision can be made of a different number of metallization planes having varying thicknesses and spacings over which the coil can extend, for example three metallization planes or more than three metallization planes, for example 4, 5, 6, 7, 8, 9, 10, 11, 12, or even more metallization planes.

In another configuration, the component arrangement includes a second metallization layer above the first metallization layer, wherein the second metallization layer includes a second metallic coupling structure, wherein an electrically conductive connection between the first metallic coupling structure and the second metallic coupling structure is realized with the aid of at least one via. The at least one via provides for example an electrically conductive connection as a vertical electrical connection between two adjacent stacked metallization layers.

In another configuration, the component arrangement includes a plurality of additional vias, as vertical electrical connections, wherein the plurality of additional vias extend at least between the first metallization layer and the second metallization layer. In another configuration, the plurality of additional vias are electrically conductively coupled in such a way that they form a coil, wherein the coil includes a coil region situated at an angle with respect to the main processing plane of the carrier.

In the context of the present disclosure, main processing plane can be understood to mean a side (surface, plane) of the carrier on which the processing steps for the manufacture of semiconductor chips and integrated circuits, e.g. lithography, etching, patterning methods, deposition of metallization layers, deposition of contacts, and the like, are usually carried out.

In the context of the present disclosure, coil region can be understood to mean a region of the metal stack which includes e.g. a first metallization layer and a second metallization layer and which defines the area, having a length LS and a width BS, which is required for the formation of the coil in the metal stack, wherein the coil region is formed in such a way that it is situated at an angle with respect to the main processing plane of the carrier, for example substantially perpendicularly to the main processing plane of the carrier.

In another configuration, the carrier includes a semiconductor material.

In another configuration, the carrier includes at least one semiconductor material from the following group of semiconductor materials: silicon, germanium, group III to V materials, polymers. In accordance with one configuration, the carrier includes a silicon-on-insulator SOI wafer. In accordance with a further configuration, the carrier includes doped or undoped (non-doped) silicon. In accordance with one embodiment, the carrier includes a semiconductor compound material, e.g. gallium arsenide (GaAs), e.g. indium phosphide (InP). In accordance with a further configuration, the carrier includes a ternary semiconductor compound material, e.g. indium gallium arsenide (InGaAs).

In another configuration, the first metallic coupling structure and/or the second metallic coupling structure include(s) a plurality of metal conductor tracks.

In accordance with one embodiment, the first metallic coupling structure and/or the second metallic coupling structure include(s) at least one of the following metals: copper, aluminum, platinum, gold, silver, palladium, nickel, or an alloy of the metals mentioned.

In accordance with one embodiment, the component arrangement furthermore includes a third metallization layer above the second metallization layer, wherein the third metallization layer includes a third metallic coupling structure, and wherein the second metallic coupling structure is electrically conductively coupled to the third metallic coupling structure by at least one via; and wherein the additional vias extend at least between the first metallization layer and the third metallization layer.

In accordance with one embodiment, the coil furthermore includes conduction structures, which electrically couple the additional vias to one another; and wherein the conduction structures run in the first metallization layer and/or the second metallization layer.

In the context of this application, a conduction structure can generally be understood to mean a metal track (metallic track), which are formed in a metallization layer in such a way as to form a coil (coil as inductive passive component having a defined inductance) by electrical connection of the additional vias. The conduction structure may include at least one material from the following group of materials, without being restricted thereto: nickel (Ni), iron (Fe), copper (Cu), aluminum (Al) or an alloy of the metals mentioned.

In another configuration, the conduction structure can be formed by one of the following methods: thermal evaporation, chemical vapor deposition, electron beam evaporation, cathode sputtering, e.g. direct-current cathode sputtering, e.g. bias cathode sputtering, insert technology, damascene technology.

In accordance with one embodiment, the coil includes at least one coil turn; wherein the at least one coil turn defines the coil region.

In this context, a coil turn can be understood to mean an electrically conductive coupling of an electrically conductive conduction structure in at least one first metallization layer to a conduction structure in at least one second metallization layer by the plurality of additional vias in such a way that the coil turn formed can generate an inductance in the event of a current flow. In this case, the coil turn must have at least one full turn.

The at least one coil turn formed defines the coil region in such a way that it delimits (defines) the area required for the formation of the coil.

In accordance with a further embodiment, the coil includes a plurality of coil turns.

In accordance with one embodiment, the plurality of additional vias extend in such a way, at least between the first metallization layer and the second metallization layer, that the coil region is situated substantially perpendicularly to the main processing surface of the carrier.

Consequently, one advantage of various embodiments can reside in the fact that the conduction structures for forming the coil are arranged substantially perpendicularly to the main processing plane, which results in a considerable saving in terms of the space requirement (relative to the available active area of the substrate, in which for example electronic semiconductor components or semiconductor circuits can be realized) of a coil in a substrate. The conduction structures in the stacked metallization layers are connected by the plurality of additional vias for example in such a way that one or more coil turns are formed in a plane substantially perpendicularly to the main processing plane of the carrier. Such a coil integrated substantially perpendicularly to the main processing plane of the carrier thus reduces the area requirement of a coil integrated into a chip and reduces the costs for a chip.

A component arrangement in accordance with a further embodiment furthermore includes: an additional carrier; a first additional metallization layer above the additional carrier; wherein the first additional metallization layer is coupled to a plurality of additional vias, such that a part of the first additional metallization layer forms a part of the coil.

The additional carrier can have the same construction as, or a similar construction to, the carrier described above.

In accordance with one embodiment, the component arrangement furthermore includes: a second additional metallization layer above the first additional metallization layer, wherein the second additional metallization layer is electrically conductively coupled to the first additional metallization layer, wherein a part of the second additional metallization layer forms a part of the coil.

In accordance with one embodiment, the additional carrier includes at least one additional electronic component which is formed in the carrier.

In accordance with one embodiment, the component arrangement furthermore includes: a plurality of additional vias, which extend at least between the first additional metallization layer and the second additional metallization layer and which form a part of the coil.

In accordance with one embodiment, the component arrangement furthermore includes: an interposer having a plurality of interposer vias; wherein the interposer vias form a part of the coil.

Such a component arrangement makes it possible to reduce the chip area required for realizing a coil in a chip, and the chip/material costs associated therewith. Furthermore, by reducing the chip area it is possible to achieve a higher degree of miniaturization. In addition, various embodiments very advantageously enable an integration of vertical coils in a 3D chip stack across a plurality of chips lying one above another, as a result of which integrated coils having a relatively high inductance can be realized.

The metallization layers described above and below (for example the first metallization layer, the second metallization layer, the third metallization layer, the first additional metallization layer, the second additional metallization layer, the coupling structures) can be formed by one of the following methods: thermal evaporation, chemical vapor deposition, electron beam evaporation, cathode sputtering, e.g. direct-current cathode sputtering, e.g. bias cathode sputtering, insert technology, damascene technology.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 1A to 1E show a component arrangement in accordance with one embodiment.

FIGS. 2A to 2C show a component arrangement in accordance with one embodiment.

FIGS. 3A to 3F show a component arrangement in accordance with one embodiment.

FIG. 4 shows a component arrangement in accordance with one embodiment.

DETAILED DESCRIPTION

Figure 1A:
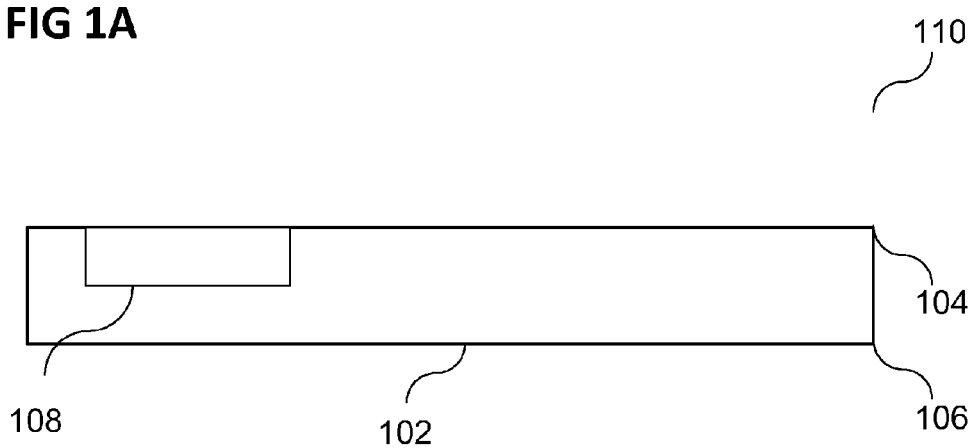
Figure 1B:
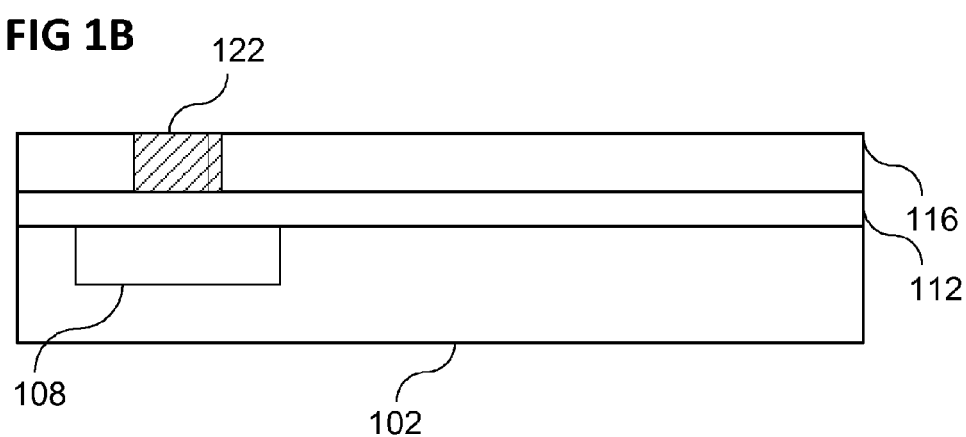

FIG. 1A to FIG. 1E show a component arrangement in accordance with one embodiment.

The component arrangement may include: a carrier 102, e.g. a substrate, e.g. a semiconductor substrate. The component arrangement may include at least one electronic component 108, which can be formed in the carrier 102. The component arrangement can furthermore include a first metallization layer 116, wherein the first metallization layer 116 may include a first metallic coupling structure 122, which is electrically conductively coupled to the at least one electronic component 108. The component arrangement may include a second metallization layer 128, which can be formed above the first metallization layer 116, wherein the second metallization layer 128 may include a second metallic coupling structure 132 and wherein the first metallic coupling structure 122 can be electrically conductively connected to the second metallic coupling structure 132 with the aid of at least one via 134 (vertical interconnect access). The component arrangement may include a plurality of additional vias 136, 138, 142 which can extend at least between the first metallization layer 116 and the second metallization layer 128 and which can be electrically conductively coupled to one another in such a way that they form a coil which may include a coil region which can be situated at an angle with respect to the main processing plane of the carrier 102.

The angle can be in a range of from greater than 0° to 90° with respect to the main processing plane of the carrier 102, for example in a range of from greater than 20° to 90°, for example in a range of from greater than 40° to 90°, for example in a range of from greater than 60° to 90°, for example in a range of from greater than 80° to 90°, for example in a range of from greater than 85° to 90°, for example of approximately 90°.

In 110 (see FIG. 1A), the component arrangement 110 may include a carrier 102, e.g. a substrate, e.g. a semiconductor substrate. The carrier 102 can have a carrier top side 104 and a carrier underside 106 arranged opposite one another, and wherein the carrier top side 104 forms the main processing plane of the carrier 102.

The carrier 102 may include at least one semiconductor material from the following group of semiconductor materials, without being restricted thereto: silicon, germanium, group III to V materials, polymers. In accordance with a further configuration, the carrier 102 may include doped or undoped (non-doped) silicon. In accordance with one configuration, the carrier 102 may include a silicon-on-insulator SOI wafer. In accordance with another configuration, the carrier 102 may include a semiconductor compound material, e.g. gallium arsenide (GaAs), e.g. indium phosphide (InP). In accordance with a further configuration, the carrier 102 may include a ternary semiconductor compound material, e.g. indium gallium arsenide (InGaAs).

The component arrangement 110 may include the carrier 102, wherein at least one electronic component 108, for example an active electronic component, can be formed in the carrier 102. The at least one electronic component 108 may include at least one of the following electronic components or be designed as such: diode, transistor, thyristor, solar cell, electro-optical component, micromechanical component.

In 120, in the component arrangement 120, a first dielectric intermediate layer 112 can be formed above the carrier 102, e.g. the carrier top side 104, e.g. the main processing plane of the carrier 102. The first dielectric intermediate layer 112 may include a dielectric material. The dielectric material may include at least one of the following materials: oxide(s), e.g. silicon dioxide ($SiO_2$), e.g. carbon-doped oxide (CDO), silicon nitride ($Si_3N_4$), low-k dielectric materials, e.g. black diamond, organic polymers, e.g. perfluorocyclobutane, e.g. polytetrafluoroethylene, fluorosilicate glass (FSG), organosilicates, e.g. silsesquioxane, e.g. siloxane, e.g. organosilicate glass. The dielectric material can have pores or vacancies. The dielectric material can be formed by various conventional methods. The dielectric material can be formed for example by thermal oxidation, chemical vapor deposition (CVD), spin-on technology.

In the component arrangement 120 (see FIG. 1B), a first metallization layer 116 can be formed above the first dielectric intermediate layer 112, wherein the first metallization layer 116 may include a first electrically conductive material.

The first electrically conductive material may include or can consist of at least one of the following materials, without being restricted thereto: aluminum (Al) and copper (Cu) or an alloy of the metals mentioned. The first electrically conductive material can be formed by various conventional methods, for example by thermal evaporation, chemical vapor deposition, electron beam evaporation, cathode sputtering, e.g. direct-current cathode sputtering, e.g. bias cathode sputtering, insert technology, damascene technology.

The first metallization layer 116 may include a first metallic coupling structure 122 (metal-containing conductor track, conductive track, conduction track), e.g. a low-resistance metallic conductor track, which realizes the electrical use within the metallization layer as a metal conductor track of high electrical conductivity. The first metallic coupling structure 122 may include a second electrically conductive material. The second electrically conductive material may include at least one from the following group of materials: copper (Cu), aluminum (Al), platinum (Pt), gold (Au), silver (Ag), palladium (Pd), nickel (Ni) or an alloy of the metals mentioned. The second electrically conductive material can be formed by various conventional methods, for example by thermal evaporation, chemical vapor deposition, electron beam evaporation, cathode sputtering, e.g. direct-current cathode sputtering, e.g. bias cathode sputtering, insert technology, damascene technology. The first metallic coupling structure 122 may include a plurality of metal conductor tracks. Furthermore, the first metallic coupling structure 122 can be electrically conductively coupled to the at least one electronic component 108. The first metallic coupling structure 122 can thus include conductor tracks which can be electrically insulated from one another by a dielectric.

In 130, a second dielectric intermediate layer 126 can be formed above the first metallization layer 116. The second dielectric intermediate layer 126 may include a dielectric material. The dielectric material may include the same dielectric material as, or a different dielectric material than, the dielectric material of the first dielectric intermediate layer 112.

A second metallization layer 128 can subsequently be formed above the second dielectric intermediate layer 126. The second metallization layer 128 may include the first electrically conductive material. The first electrically conductive material may include the same first electrically conductive material as, or a different first electrically conductive material than, the first electrically conductive material of the first metallization layer 116.

The second metallization layer 128 may include a second metallic coupling structure 132, which may include the second electrically conductive material. The second electrically conductive material may include the same second electrically conductive material as, or a different second electrically conductive material than, the second electrically conductive material of the first metallic coupling structure 122. The second metallic coupling structure 132 can thus include conductor tracks which can be electrically insulated from one another by a dielectric.

In FIG. 1C, in the component arrangement 130, in accordance with one configuration, the first metallic coupling structure 122 can be electrically conductively coupled to the second metallic coupling structure 132 by at least one via 134, wherein the at least one via 134 can extend through between the carrier 102 and the second metallization layer 128 and/or between the carrier 102 and the first metallization layer 116 and/or between the first metallization layer 116 and the second metallization layer 128.

The at least one via 134 can be formed by various conventional methods. By way of example, in accordance with one configuration, the at least one via 134 can be formed using a drilling process, e.g. a laser drilling process, or by a lithography process, including one or a plurality of exposure processes and one or a plurality of etching processes. The laser drilling process can be carried out e.g. using a laser, e.g. a $CO_2$ laser. The laser drilling can be carried out in order to produce the at least one via 134, i.e. a hole. In another configuration, the at least one via 134 can be formed, for example, by mechanical drilling. In a further configuration, the at least one via 134 may include a prefilled via. The type of the at least one via 134 formed is not restricted with regard to the use of the component arrangement which is the subject matter of this disclosure.

Afterward, a filling of the at least one via 134 can be carried out by various conventional methods in order to provide a contact metallization. The at least one via 134 can be filled with a third electrically conductive material. The third electrically conductive material may include at least one from the following group of materials: copper, aluminum, tungsten, cobalt, silver, titanium, tantalum or an alloy of the metals mentioned.

In FIG. 1D, in accordance with one configuration, a plurality of additional vias 136, 138, 142 can be formed in the component arrangement 140.

The plurality of additional vias 136, 138, 142 can be formed by various conventional methods. The plurality of additional vias 136, 138, 142 can be formed by the same conventional method as, or a different conventional method than, the conventional method which can be used for forming the at least one via 134.

Afterward, a filling of the plurality of additional vias 136, 138, 142 can be carried out by various conventional methods in order to provide a contact metallization. The plurality of additional vias 136, 138, 142 can be filled with the third electrically conductive material. The third electrically conductive material may include the same third electrically conductive material as, or a different third electrically conductive material than, the third electrically conductive material of the at least one via 134.

The plurality of additional vias 136, 138, 142 can extend at least between the carrier 102 and the second metallization layer 128. The plurality of additional vias 136, 138, 142 can extend at least between the carrier 102 and the first metallization layer 116. The plurality of additional vias 136, 138, 142 can extend at least between the first metallization layer 116 and the second metallization layer 128.

FIG. 1E shows, in accordance with one configuration, the component arrangement 150, wherein the component arrangement 150 includes: the carrier 102, e.g. a substrate, e.g. a semiconductor substrate; the at least one electronic component 108, formed in the carrier 102; the first metallization layer 116, wherein the first metallization layer 116 may include the first metallic coupling structure 122, which can be electrically conductively coupled to the at least one electronic component 108; the second metallization layer 128, formed above the first metallization layer 116, wherein the second metallization layer 128 may include the second metallic coupling structure 132 and wherein the first metallic coupling structure 122 can be electrically conductively connected to the second metallic coupling structure 132 by the at least one via 134; and the plurality of additional vias 136, 138, 142.

The first metallization layer 116 and/or the second metallization layer 128 may include the first electrically conductive material. The first electrically conductive material may include the same first electrically conductive material as, or a different first electrically conductive material than, the first electrically conductive material of the first metallization layer 116 and/or of the second metallization layer 128.

The first metallic coupling structure 122 and/or the second metallic coupling structure 132 may include the second electrically conductive material. The second electrically conductive material may include the same second electrically conductive material as, or a different second electrically conductive material than, the second electrically conductive material of the first metallic coupling structure 122 and/or of the second metallic coupling structure 132. The first metallic coupling structure 122 and/or the second metallic coupling structure 132 can thus include conductor tracks which can be electrically insulated from one another by a dielectric.

In FIG. 1E, the plurality of additional vias 136, 138, 142 can be electrically conductively coupled by a plurality of conduction structures 144, 146 in such a way that they form a coil 152, wherein the coil 152 includes a coil region 154 which can be situated at an angle with respect to the main processing plane of the carrier 120, e.g. the carrier top side 104 of the carrier 102.

The plurality of conduction structures 144, 146 can run at least in the first metallization layer 116 and/or the second metallization layer 128, wherein the plurality of conduction structures 144, 146 may include a fourth electrically conductive material 156, the fourth electrically conductive material 156 including at least one from the following group of materials: copper (Cu), aluminum (Al), platinum (Pt), gold (Au), silver (Ag), palladium (Pd), nickel (Ni) or an alloy of the metals mentioned. The fourth electrically conductive material 156 can be formed by various conventional methods, for example by thermal evaporation, chemical vapor deposition, electron beam evaporation, cathode sputtering, e.g. direct-current cathode sputtering, e.g. bias cathode sputtering, insert technology, damascene technology.

The coil 152 (coil as a passive inductive electronic component having a defined inductance and quality factor) may include the coil region 154, wherein the coil region can be understood as a region of a metal stack, including e.g. the first metallization layer 116 and the second metallization layer 128, which can define the area required for forming the coil 152 in the metal stack, having a length, a width, and also a depth. The coil region 154 can be formed in such a way that it can be situated at an angle with respect to the main processing plane of the carrier 102, for example substantially perpendicularly to the main processing plane of the carrier 102, for example substantially perpendicularly to the carrier top side 104 of the carrier 102. In this case, the angle can be in a range of from greater than 0° to 90° with respect to the main processing plane of the carrier 102, for example in a range of from greater than 20° to 90°, for example in a range of from greater than 40° to 90°, for example in a range of from greater than 60° to 90°, for example in a range of from greater than 80° to 90°, for example in a range of from greater than 85° to 90°, for example of approximately 90°.

Figure 2C:
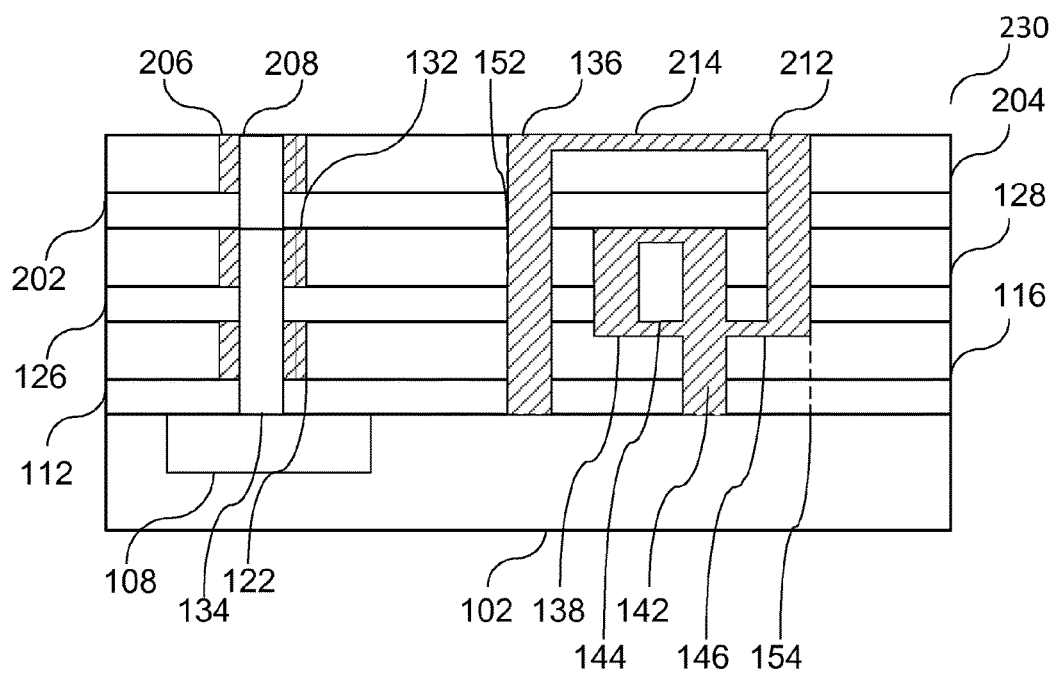

FIG. 2A to FIG. 2C show a component arrangement in accordance with one embodiment.

In FIG. 2A to FIG. 2C, identical reference signs designate the same parts and/or the same features as were described above with regard to FIG. 1A to FIG. 1E. Substantially only the differences between the component arrangement as illustrated in FIG. 2A to FIG. 2C and the component arrangement as illustrated in FIG. 1A to FIG. 1E are explained below. With regard to the other features, reference is made to the above explanations concerning FIG. 1A to FIG. 1E.

In a component arrangement 210 (see FIG. 2A), a third dielectric intermediate layer 202 can be formed above the second metallization layer 128. The third dielectric intermediate layer 202 may include the dielectric material. The dielectric material may include the same dielectric material as, or a different dielectric material than, the dielectric material of the first dielectric intermediate layer 112 and/or of the second dielectric intermediate layer 128.

In 210 (see FIG. 2A), a third metallization layer 204 can be formed above the third dielectric intermediate layer 202, wherein the third metallization layer 204 may include the first electrically conductive material. The first electrically conductive material may include the same first electrically conductive material as, or a different first electrically conductive material than, the first electrically conductive material of the first metallization layer 116 and/or of the second metallization layer 128.

The third metallization layer 204 may include a third metallic coupling structure 206. The third metallic coupling structure 206 may include the second electrically conductive material. The second electrically conductive material may include the same second electrically conductive material as, or a different second electrically conductive material than, the second electrically conductive material of the first metallic coupling structure 122 and/or of the second metallic coupling structure 132. The third metallic coupling structure 206 can thus include conductor tracks which can be electrically insulated from one another by a dielectric. The third metallic coupling structure 206 can be electrically conductively coupled to the second metallic coupling structure 132 by at least one via 208.

In FIG. 2A, in accordance with one configuration, a plurality of additional vias 136, 138, 142, 212 can be formed in the component arrangement 210.

The at least one via 208 and/or the plurality of additional vias 136, 138, 142, 212 can be formed by various conventional methods. The at least one via 208 and/or the plurality of additional vias 136, 138, 142, 212 can be formed by the same conventional method as, or a different conventional method than, the conventional method which can be used for forming the at least one via 134 and/or the plurality of additional vias 136, 142.

Afterward, a filling of the at least one via 208 and/or of the plurality of additional vias 136, 138, 142, 212 can be carried out by various conventional methods. The at least one via 208 and/or the plurality of additional vias 136, 138, 142, 212 can be filled with the third electrically conductive material. The third electrically conductive material may include the same third electrically conductive material as, or a different third electrically conductive material than, the third electrically conductive material of the at least one via 134 and/or of the plurality of additional vias 136, 138, 142.

The at least one via 208 can extend at least between the second metallization layer 128 and the third metallization layer 204.

The plurality of additional vias 136, 138, 142, 212 can extend at least between the carrier 102 and the third metallization layer 204. The plurality of additional vias 136, 138, 142, 212 can extend at least between the carrier 102 and the third metallization layer 204. The plurality of additional vias 136, 138, 142, 212 can extend at least between the carrier 102 and the second metallization layer 128. The plurality of additional vias 136, 138, 142, 212 can extend at least between the carrier 102 and the first metallization layer 116. The plurality of additional vias 136, 138, 142, 212 can extend at least between the first metallization layer 116 and the third metallization layer 204. The plurality of additional vias 136, 138, 142, 212 can extend at least between the first metallization layer 116 and the second metallization layer 128. The plurality of additional vias 136, 138, 142, 212 can extend at least between the second metallization layer 128 and the third metallization layer 204.

In 220 (see FIG. 2B), a component arrangement 220 can furthermore include a plurality of conduction structures 144, 146. The plurality of conduction structures 144, 146 may include the fourth electrically conductive material 156, wherein the fourth electrically conductive material 156 may include at least one from the following group of materials: copper (Cu), aluminum (Al), platinum (Pt), gold (Au), silver (Ag), palladium (Pd), nickel (Ni) or an alloy of the metals mentioned. The fourth electrically conductive material 156 can be formed by various conventional methods, for example by thermal evaporation, chemical vapor deposition, electron beam evaporation, cathode sputtering, e.g. direct-current cathode sputtering, e.g. bias cathode sputtering, insert technology, damascene technology.

In 220, the plurality of additional vias 136, 138, 142 can be electrically conductively coupled by the plurality of conduction structures 144, 146 in such a way that they form a coil 152, the coil 152 including a coil region 154 which can be situated at an angle with respect to the main processing plane of the carrier 120, e.g. the carrier top side 104 of the carrier 102. Furthermore, the plurality of conduction structures 144, 146 can run at least in the first metallization layer 116 and/or the second metallization layer 128. The coil 152 formed in 220 can have at least one coil turn, wherein the at least one coil turn defines the coil region 154.

FIG. 2C shows a component arrangement 230, wherein the component arrangement 230 furthermore includes the coil 152, wherein the coil 152 can furthermore include a plurality of coil turns.

In 230 (see FIG. 2C) in accordance with one configuration, the plurality of additional vias 136, 138, 142, 212 can be electrically conductively coupled by a plurality of conduction structures 144, 146, 214 in such a way that they form a coil 152 including the coil region 154.

The plurality of conduction structures 144, 146, 214 may include the fourth electrically conductive material 156. The fourth electrically conductive material 156 may include the same fourth electrically conductive material as, or a different fourth electrically conductive material than, the fourth electrically conductive material of the plurality of conduction structures 144, 146.

In 230, the plurality of additional vias 136, 138, 142, 212 can be formed in such a way that the plurality of additional vias 136, 138, 142, 212 extend at least between the first metallization layer 116 and the second metallization layer 128 in such a way that the coil region 154 is situated substantially perpendicularly to the main processing plane of the carrier 102, e.g. the carrier top side 104 of the carrier 102.

FIG. 3A to FIG. 3F show a component arrangement in accordance with one embodiment.

In FIG. 3A to FIG. 3F, identical reference signs designate the same parts and/or the same features as were described above with regard to FIG. 1A to FIG. 1E and/or to FIG. 2A to FIG. 2C. Substantially only the differences between the component arrangement as illustrated in FIG. 3A to FIG. 3F and the component arrangement as illustrated in FIG. 1A to FIG. 1E and/or FIG. 2A to FIG. 2C are explained below. With regard to the other features, reference is made to the above explanations concerning FIG. 1A to FIG. 1E and/or FIG. 2A to FIG. 2C.

Figure 3A:
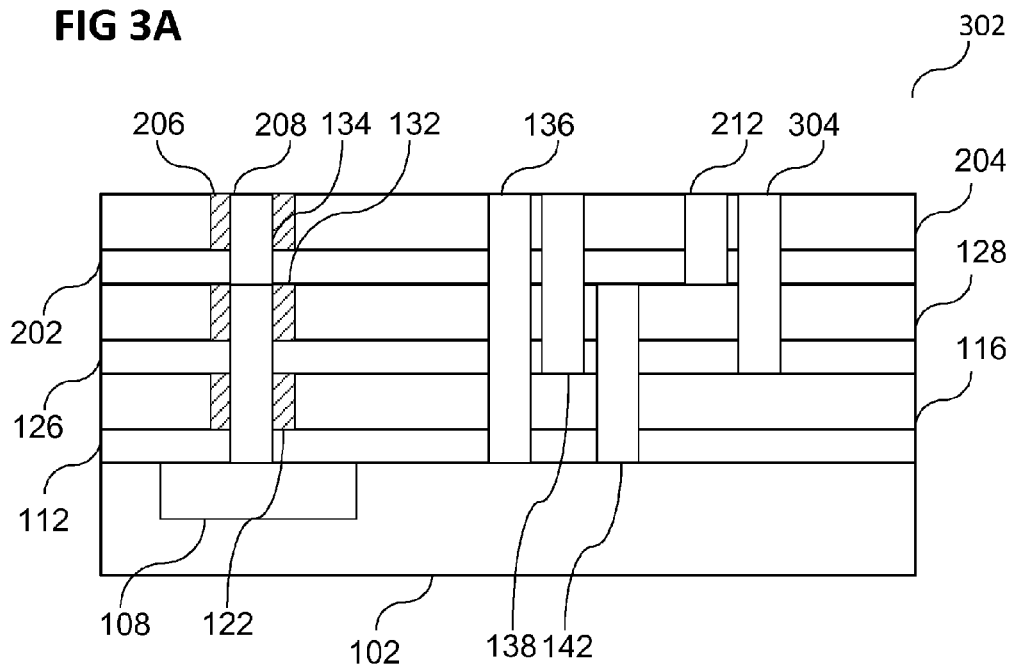

In FIG. 3A (in 310), in accordance with one configuration, a plurality of additional vias 136, 138, 142, 212, 304 can be formed by various conventional methods. The plurality of additional vias 136, 138, 142, 212, 304 can be formed by the same conventional method as, or a different conventional method than, the conventional method which can be used for forming the at least one via 134 and/or the at least one via 208 and/or the plurality of additional vias 136, 142, 212. Afterward, a filling of the plurality of additional vias 136, 138, 142, 212, 304 can be carried out by various conventional methods. The plurality of additional vias 136, 138, 142, 212, 304 can be filled with the third electrically conductive material. The third electrically conductive material may include the same third electrically conductive material as, or a different third electrically conductive material than, the third electrically conductive material of the at least one via 134 and/or of the at least one via 208 and/or of the plurality of additional vias 136, 138, 142, 212.

In accordance with one configuration, the plurality of additional vias 136, 138, 142, 212, 304 can extend at least between the carrier 102 and the third metallization layer 204. In accordance with another configuration, the plurality of additional vias 136, 138, 142, 212, 304 can extend at least between the first metallization layer 116 and the third metallization layer 204. The plurality of additional vias 136, 138, 142, 212, 304 can extend at least between the carrier 102 and the second metallization layer 128. The plurality of additional vias 136, 138, 142, 212, 304 can extend at least between the carrier 102 and the first metallization layer 116. The plurality of additional vias 136, 138, 142, 212, 304 can extend at least between the first metallization layer 116 and the second metallization layer 128. The plurality of additional vias 136, 138, 142, 212, 304 can extend at least between the second metallization layer 128 and the third metallization layer 204.

Figure 3B:
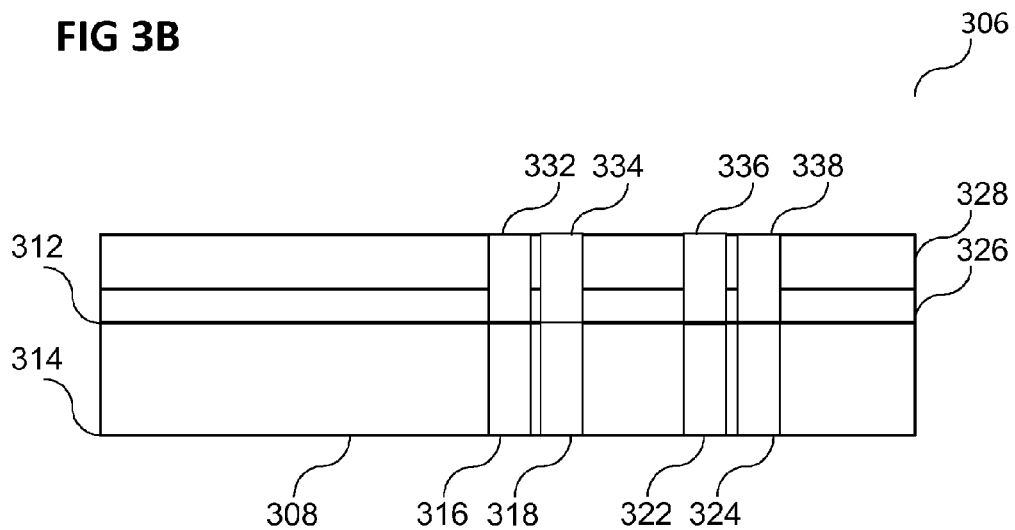

FIG. 3B illustrates a second component arrangement 306, which may include at least one additional carrier 308. It should be pointed out that provision can also be made of more than one additional carrier in various embodiments, for example 2, 3, 4, 5, 6, 7 or even more.

The additional carrier 308, e.g. a substrate, e.g. a semiconductor substrate, can have a carrier top side 312 and a carrier underside 314 arranged opposite one another, and wherein the carrier top side 312 forms the main processing plane of the additional carrier 308.

The additional carrier 308 may include at least one semiconductor material. The additional carrier 308 may include the same semiconductor material as, or a different semiconductor material than, the carrier 102.

In the additional carrier 308, a plurality of through silicon vias (TSV) 316, 318, 322, 324 for realizing electrical connections (couplings) between a plurality of component arrangements (chips) in the 3D integration, can be formed by various conventional methods. In one configuration, the plurality of through silicon vias 316, 318, 322, 324 can be formed by a mechanical drilling process, alternatively by one or a plurality of lithography processes which can contain one or a plurality of exposure processes and one or a plurality of etching processes. In another configuration, the plurality of through silicon vias 316, 318, 322, 324 can be formed by laser ablation. In a further configuration, the plurality of through silicon vias 316, 318, 322, 324 can be formed by an etching process, e.g. by a wet-chemical etching process, e.g. by a dry etching process such as, for example, deep reactive ion etching (DRIE). A filling of the plurality of through silicon vias 316, 318, 322, 324 can subsequently be carried out by various conventional methods. The plurality of through silicon vias 316, 318, 322, 324 can be filled with the third electrically conductive material. The third electrically conductive material may include the same third electrically conductive material as, or a different third electrically conductive material than, the third electrically conductive material of the at least one via 134 and/or of the at least one via 208 and/or of the plurality of additional vias 136, 138, 142, 212, 304.

A first additional dielectric intermediate layer 326 can be formed above the additional carrier 308. The first additional intermediate layer 326 may include the dielectric material. The dielectric material may include the same dielectric material as, or a different dielectric material than, the dielectric material of the first dielectric intermediate layer 112.

In accordance with one configuration, a first additional metallization layer 328 can be formed above the first additional dielectric intermediate layer 326, wherein the first additional metallization layer 328 may include the first electrically conductive material. The first electrically conductive material may include the same first electrically conductive material as, or a different first electrically conductive material than, the first electrically conductive material of the first metallization layer 116 and/or of the second metallization layer 128 and/or of the third metallization layer 204.

Furthermore, the second component arrangement 306, as shown in FIG. 3B, in accordance with one configuration, may include at least a plurality of additional vias 332, 334, 336, 338 which can be formed by various conventional methods. The plurality of additional vias 332, 334, 336, 338 can be formed by the same conventional method as, or a different conventional method than, the conventional method which can be used for forming the at least one via 134 and/or the at least one via 208 and/or the plurality of additional vias 136, 142, 212, 304. Afterward, a filling of the at least plurality of additional vias 332, 334, 336, 338 can be carried out by various conventional methods in order to provide a contact metallization. The plurality of additional vias 332, 334, 336, 338 can be filled with the third electrically conductive material. The third electrically conductive material may include the same third electrically conductive material as, or a different third electrically conductive material than, the third electrically conductive material of the at least one via 134 and/or of the at least one via 208 and/or of the plurality of additional vias 136, 138, 142, 212, 304 and/or of the plurality of through silicon vias 316, 318, 322, 324.

The at least two additional vias 332, 334, 336, 338 can extend at least between the additional carrier 308 and the first additional metallization layer 328.

In FIG. 3C (in 330), in accordance with one configuration, the second component arrangement 306, as shown in FIG. 3B and described above, can be arranged above and electrically conductively coupled to the first component arrangement 302, as shown in FIG. 3A and described above, by a plurality of chip connections 342, 344 with the aid of the plurality of additional vias 136, 304 and the plurality of through silicon vias 316, 324 using various conventional methods, for example flip-chip mounting.

In accordance with one configuration, the plurality of chip connections 342, 344 can be formed with the aid of various conventional methods. In one embodiment, the plurality of chip connections 342, 344 can be formed by soldering, e.g. using a solder, for example using an electrically conductive solder, e.g. a soft solder, e.g. a diffusion solder. In another configuration, the plurality of chip connections 342, 344 can be formed by adhesive bonding, for example using an adhesive, e.g. an electrically conductive adhesive, e.g. an electrically isotropically conductive adhesive, e.g. an electrically anisotropically conductive adhesive.

In accordance with one configuration, the first additional metallization layer 328 can be electrically conductively coupled to the plurality of additional vias 136, 304 in such a way that at least one part of the first additional metallization layer 328 forms a part of the coil 152. In one configuration, the first additional metallization layer 328 can be electrically conductively coupled to the plurality of additional vias 136, 304 using the plurality of chip connections 342, 344 and an additional conduction structure 346 in such a way that at least one part of the first additional metallization layer 328 forms a part of the coil 152. In one configuration, the additional conduction structure 346 may include the fourth electrically conductive material 156, and the fourth electrically conductive material 156 may include the same fourth electrically conductive material as, or a different fourth electrically conductive material than, the fourth electrically conductive material of the plurality of conduction structures 144, 146 and/or of the plurality of conduction structures 146, 212.

Figure 3D:
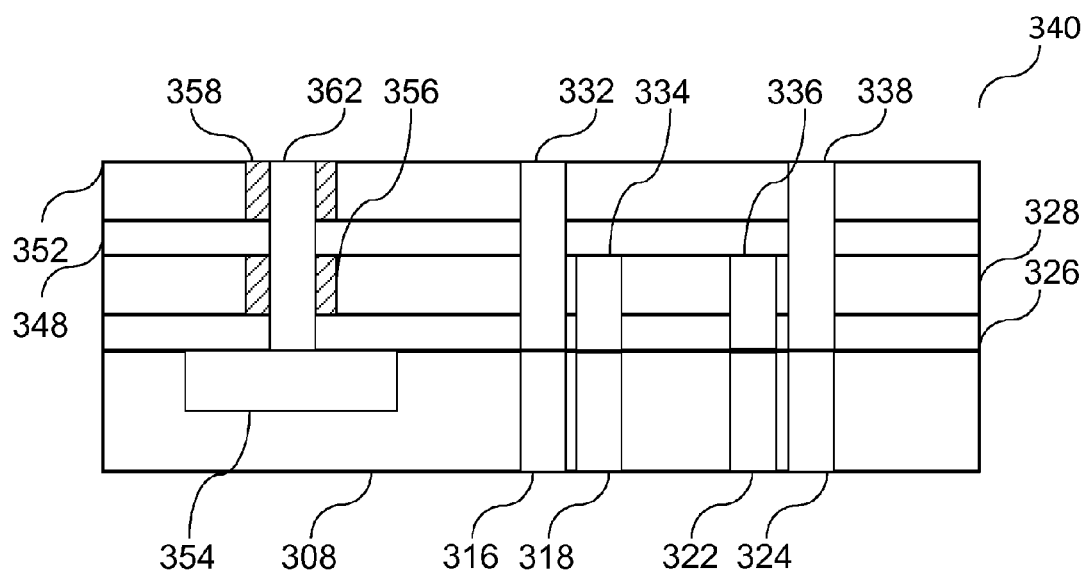

In accordance with one configuration, at least one additional electronic component 354, for example an active electronic component, can be formed in the additional carrier 308 of the second component arrangement 306, as shown in FIG. 3D in the component arrangement 340. The at least one additional electronic component 354 may include at least one of the following electronic components or be designed as such: resistor, diode, transistor, capacitor, coil, thyristor, solar cell, electro-optical component, micromechanical component.

In accordance with one configuration, in FIG. 3D (see 340), a second additional dielectric intermediate layer 348 can be formed above the first additional metallization layer 328. The second additional dielectric intermediate layer 348 can have one or more or all of the features as already described with regard to the first dielectric intermediate layer 112 and/or the second dielectric intermediate layer 123 and/or the third dielectric intermediate layer 202 and/or the first additional dielectric intermediate layer 326.

In accordance with one configuration, a second additional metallization layer 352 can subsequently be formed above the second additional dielectric intermediate layer 348. The second additional metallization layer can have one or more or all of the features as already described with regard to the first metallization layer 116 and/or the second metallization layer 128 and/or the third metallization layer 204 and/or the first additional metallization layer 328.

In accordance with one configuration, the first additional metallization layer 328 may include a first additional metallic coupling structure 356, which is electrically conductively coupled to the at least one additional electronic component 354, and the second additional metallization layer 352 may include a second additional metallic coupling structure 358. The first additional metallic coupling structure 356 and/or the second additional metallic coupling structure 358 can have one or more or all of the features as already described with regard to the first metallic coupling structure 122 and/or the second metallic coupling structure 132 and/or the third metallic coupling structure 206.

In another configuration, the first additional metallic coupling structure 356 and/or the second additional metallic coupling structure 358 include a plurality of metal conductor tracks. The first additional metallic coupling structure 356 and/or the second additional metallic coupling structure 358 can thus include conductor tracks which can be electrically insulated from one another by a dielectric.

In accordance with one configuration, the first additional metallization layer 328 including the first additional metallic coupling structure 352 can be electrically conductively coupled, with the aid of at least one via 362, to the second additional metallization layer 352 having the second additional metallic coupling structure 358, wherein the at least one via 362 can extend between the first additional metallization layer 328 and the second additional metallization layer 352. The at least one via 362 can have one or more or all of the features as already described with regard to the at least one via 134 and/or the at least one via 208 and/or the plurality of additional vias 136, 138, 142, 212, 304 and/or the plurality of additional vias 332, 334, 336, 338.

Furthermore, in accordance with one configuration, the plurality of additional vias 332, 334, 336, 338 can extend at least between the first additional metallization layer 328 and the second additional metallization layer 352 and/or between the additional carrier 308 and the first additional metallization layer 328 and/or between the additional carrier 308 and the second additional metallization layer 352.

Figure 3E:
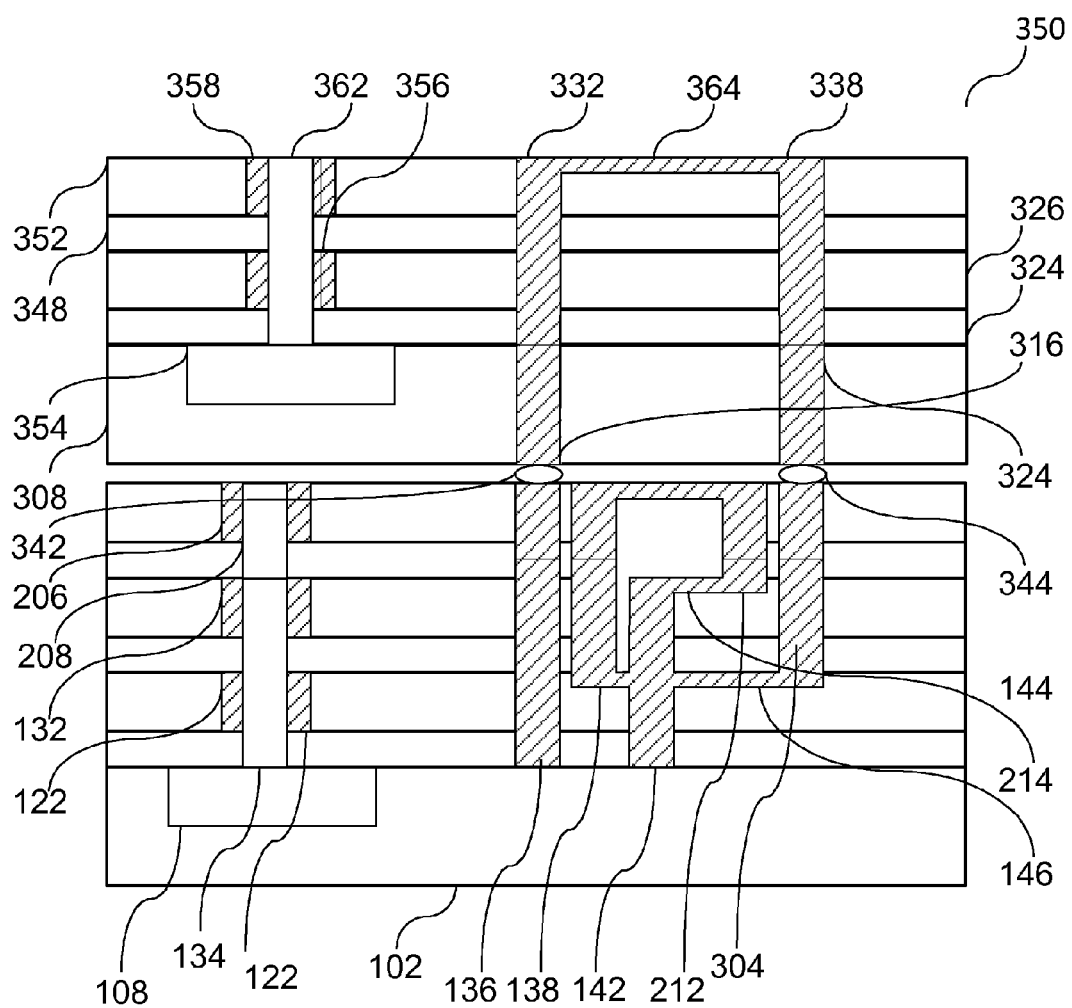

In accordance with one embodiment, in FIG. 3E, the component arrangement 340, as shown in FIG. 3D and described above, can be arranged above and electrically conductively coupled to the first component arrangement 302, as shown in FIG. 3A and described above, by the plurality of chip connections 342, 344 with the aid of the plurality of additional vias 136, 304 and the plurality of through silicon vias 316, 324 using various conventional methods, for example flip-chip mounting.

In accordance with one configuration, the plurality of chip connections 342, 344 can be formed by various conventional methods, as described above in 330. In one configuration, the plurality of chip connections 342, 344 can be formed by soldering, e.g. using a solder, for example using an electrically conductive solder, e.g. a soft solder, e.g. a diffusion solder. In another configuration, the plurality of chip connections 342, 344 can be formed by adhesive bonding, for example using an adhesive (also referred to as adhesive medium, adhesive bond), e.g. an electrically conductive adhesive, e.g. an electrically isotropically conductive adhesive, e.g. an electrically anisotropically conductive adhesive.

In accordance with one configuration, the second additional metallization layer 352 can be electrically conductively coupled to the plurality of additional vias 136, 304 in such a way that at least one part of the second additional metallization layer 352 forms a part of the coil. In one configuration, the second additional metallization layer 352 can be electrically conductively coupled by the plurality of additional vias 136, 304 using the plurality of chip connections 342, 344 and an additional conduction structure 364 in such a way that at least one part of the second additional metallization layer 352 forms a part of the coil. In one configuration, the additional conduction structure 364 can have one or more or all of the features as already described with regard to the conduction structures 144, 146 and/or the conduction structure 214 and/or the additional conduction structure 346.

Figure 3F:
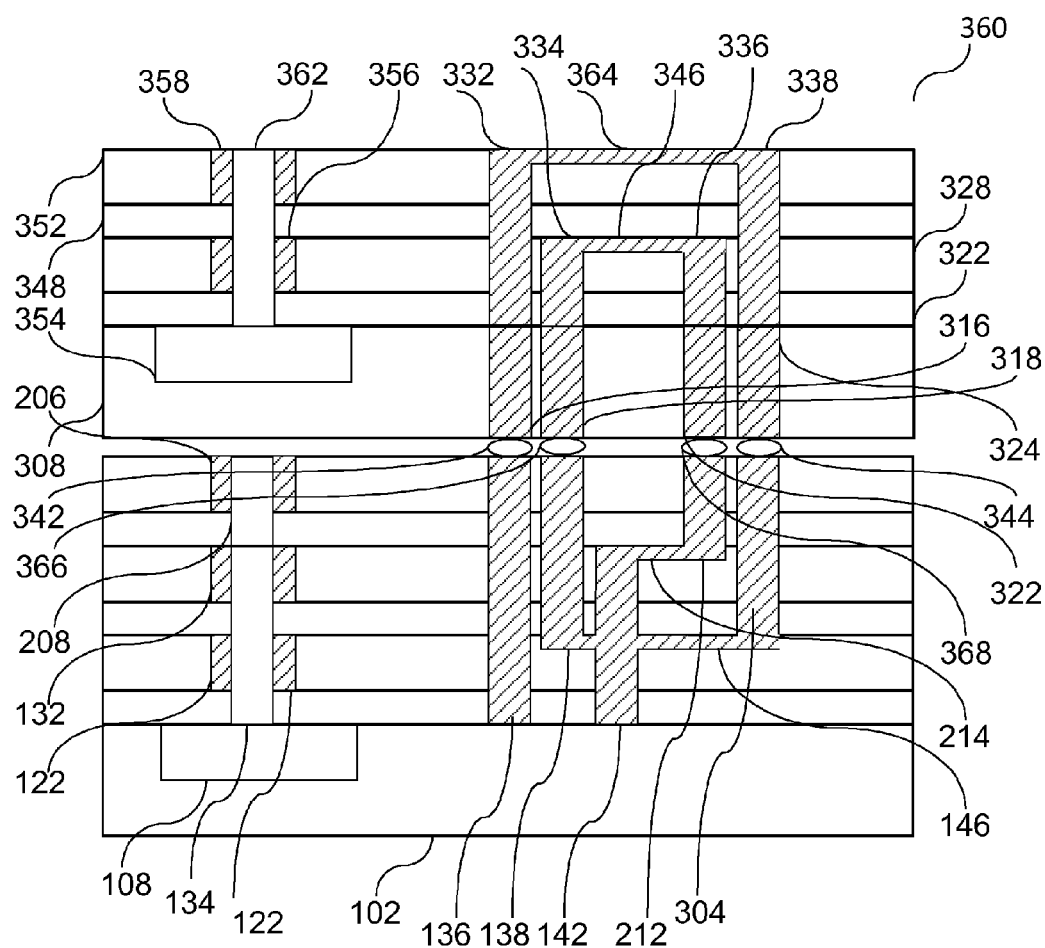

In accordance with one embodiment, in FIG. 3F (in 360), the component arrangement 340, as shown in FIG. 3D and described above, can be arranged above and electrically conductively coupled to the first component arrangement 302, as described above, by the plurality of chip connections 342, 344, 366, 368 with the aid of the plurality of additional vias 332, 334, 336, 338 and the plurality of through silicon vias 316, 318, 322, 324 using various conventional methods, for example flip-chip mounting.

In 360, the component arrangement 360 may include a plurality of additional vias 332, 334, 336, 338. The plurality of additional vias 332, 334, 336, 338 can have one or more or all of the features as already described with regard to the at least one via 134 and/or the at least one via 362 and/or the plurality of additional vias 136, 138, 142, 212, 304. Furthermore, in accordance with one configuration, the plurality of additional vias 332, 334, 336, 338 can extend at least between the first additional metallization layer 328 and the second additional metallization layer 34 and/or between the additional carrier 308 and the first additional metallization layer 328 and/or between the additional carrier 308 and the second additional metallization layer 352.

In accordance with one configuration, the first additional metallization layer 328 and/or the second additional metallization layer 352 can be electrically conductively coupled to the plurality of additional vias 136, 138, 142, 212, 304 in such a way that at least one part of the first additional metallization layer 328 and/or at least one part of the second additional metallization layer 352 forms a part of the coil 152. In one configuration, the first metallization layer 328 and/or the second additional metallization layer 352 can be electrically conductively coupled by the plurality of additional vias 136, 138, 142, 212, 304 using the plurality of chip connections 342, 344, 366, 368 and at least the additional conduction structures 346, 364 in such a way that at least one part of the first additional metallization layer 328 and/or of the second additional metallization layer 352 form a part of the coil.

In accordance with one configuration, the plurality of chip connections 342, 344, 366, 368 can be formed by various conventional methods, as described above in 330. In one configuration, the plurality of chip connections 342, 344, 366, 368 can be formed by soldering, e.g. using a solder, for example using an electrically conductive solder, e.g. a soft solder, e.g. a diffusion solder. In another configuration, the plurality of chip connections 336, 338, 366, 368 can be formed by adhesive bonding, for example using an adhesive, e.g. an electrically conductive adhesive, e.g. an electrically isotropically conductive adhesive, e.g. an electrically anisotropically conductive adhesive.

FIG. 4 shows a component arrangement in accordance with one embodiment.

In FIG. 4, identical reference signs designate the same parts and/or the same features as have already been described above with reference to FIG. 1A to FIG. 1E and/or FIG. 2A to FIG. 2C and/or FIG. 3A to FIG. 3F. Substantially only the differences between the component arrangement as illustrated in FIG. 3A to FIG. 3F and the component arrangement as illustrated in FIG. 1A to FIG. 1E and/or FIG. 2A to FIG. 2C and/or FIG. 3A to FIG. 3F are explained below. With regard to the other features, reference is made to the above explanations concerning FIG. 1A to FIG. 1E and/or FIG. 2A to FIG. 2C and/or FIG. 3A to FIG. 3F.

In accordance with one configuration, the component arrangement 340 as shown in FIG. 3D and described above can be arranged above the first component arrangement 302, as shown in FIG. 3A and described above, using an interposer 402 including a plurality of interposer vias 404, and the plurality of chip connections 342, 344, 366, 368 and a plurality of chip connections 406.

In accordance with one configuration, an interposer 402 may include at least one from the following group of materials: silicon, glass, an electrically insulating polymer.

The interposer 402 can be provided with the aid of various conventional methods, for example by silicon interposer technology.

The interposer 402 can have a thickness (top side to underside) in a range of approximately 300 μm to approximately 400 μm, but the thickness can vary greatly and is dependent on the technology respectively used.

In one configuration, the interposer 402 may include a plurality of interposer vias 404 for realizing an electrical connection (coupling) between a plurality of chips in the 3D integration, which can be formed with the aid of various conventional methods.

In one configuration, the plurality of interposer vias 404 can be formed in the interposer 402 by a drilling process, e.g. by a laser drilling process, e.g. by mechanical drilling. In another configuration, the plurality of interposer vias 404 can be formed in the interposer 402 by an etching process, e.g. by a wet-chemical etching process, e.g. by a dry etching process, e.g. by plasma etching. Afterward, a filling of the plurality of interposer vias 404 can be carried out by various conventional methods. The plurality of interposer vias 404 can be filled with the third electrically conductive material. The third electrically conductive material may include the same third electrically conductive material as, or a different third electrically conductive material than, the third electrically conductive material of the at least one via 134 and/or of the at least one via 208 and/or of the plurality of vias 136, 138, 142, 212, 304 and/or of the plurality of through silicon vias 316, 318, 322, 324 and/or of the plurality of additional vias 332, 334, 336, 338.

The component arrangement 400 may include a plurality of additional vias 332, 334, 336, 338. The plurality of additional vias 332, 334, 336, 338 can have one or more or all of the features as already described with regard to the at least one via 134 and/or the at least one via 366 and/or the plurality of additional vias 136, 138, 142, 212, 304. Furthermore, in accordance with one configuration, the plurality of additional vias 332, 334, 336, 338 can extend at least between the first additional metallization layer 328 and the second additional metallization layer 352 and/or between the additional carrier 308 and the first additional metallization layer 328 and/or between the additional carrier 308 and the second additional metallization layer 352.

In accordance with one configuration, the first additional metallization layer 328 and/or the second additional metallization layer 352 can be electrically conductively coupled to the plurality of additional vias 136, 138, 142, 212, 304 in such a way that at least one part of the first additional metallization layer 328 and/or at least one part of the second additional metallization layer 352 forms a part of the coil 152. In one configuration, the first metallization layer 328 and/or the second additional metallization layer 352 can be electrically conductively coupled by the plurality of additional vias 136, 138, 142, 212, 304 using the plurality of chip connections 342, 344, 366, 368, the plurality of chips connections 406 and the interposer 402, which includes the plurality of interposer vias 404, and at least the additional conduction structures 346, 364 in such a way that at least one part of the first additional metallization layer 328 and/or of the second additional metallization layer 352 form a part of the coil.

In accordance with one configuration, the plurality of chip connections 342, 344, 366, 368 and/or the plurality of chip connections 406 can be formed by various conventional methods, as described above in 330. In one configuration, the plurality of chip connections 342, 344 and/or the plurality of chip connections 406 can be formed by soldering, e.g. using a solder, for example using an electrically conductive solder, e.g. a soft solder, e.g. a diffusion solder. In another configuration, the plurality of chip connections 342, 344, 366, 368 and/or the plurality of chip connections 406 can be formed by adhesive bonding, for example using an adhesive, e.g. an electrically conductive adhesive, e.g. an electrically isotropically conductive adhesive, e.g. an electrically anisotropically conductive adhesive.

Figure 5A:
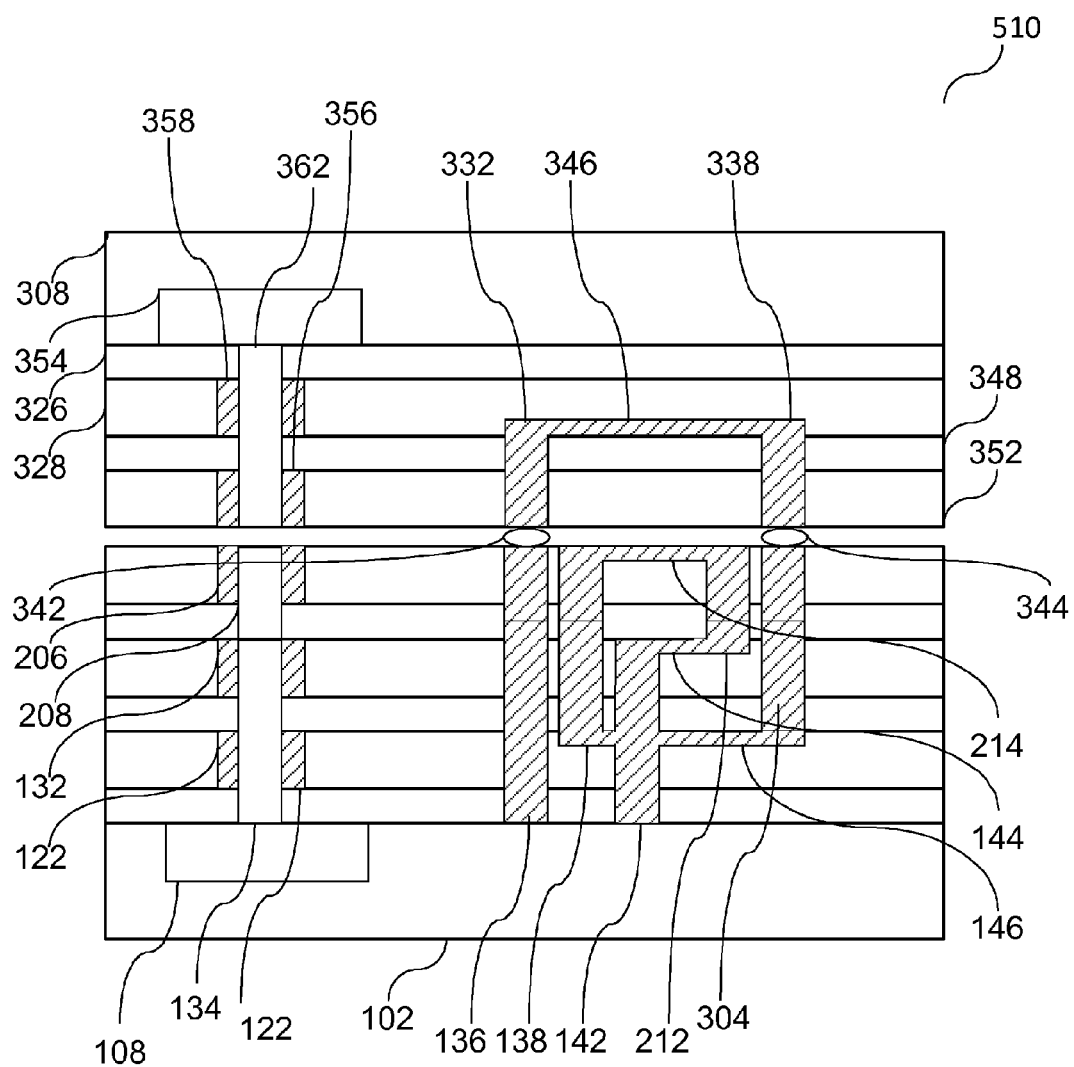
FIGS. 5A and 5B show a component arrangement in accordance with a further embodiment.
Figure 5B:
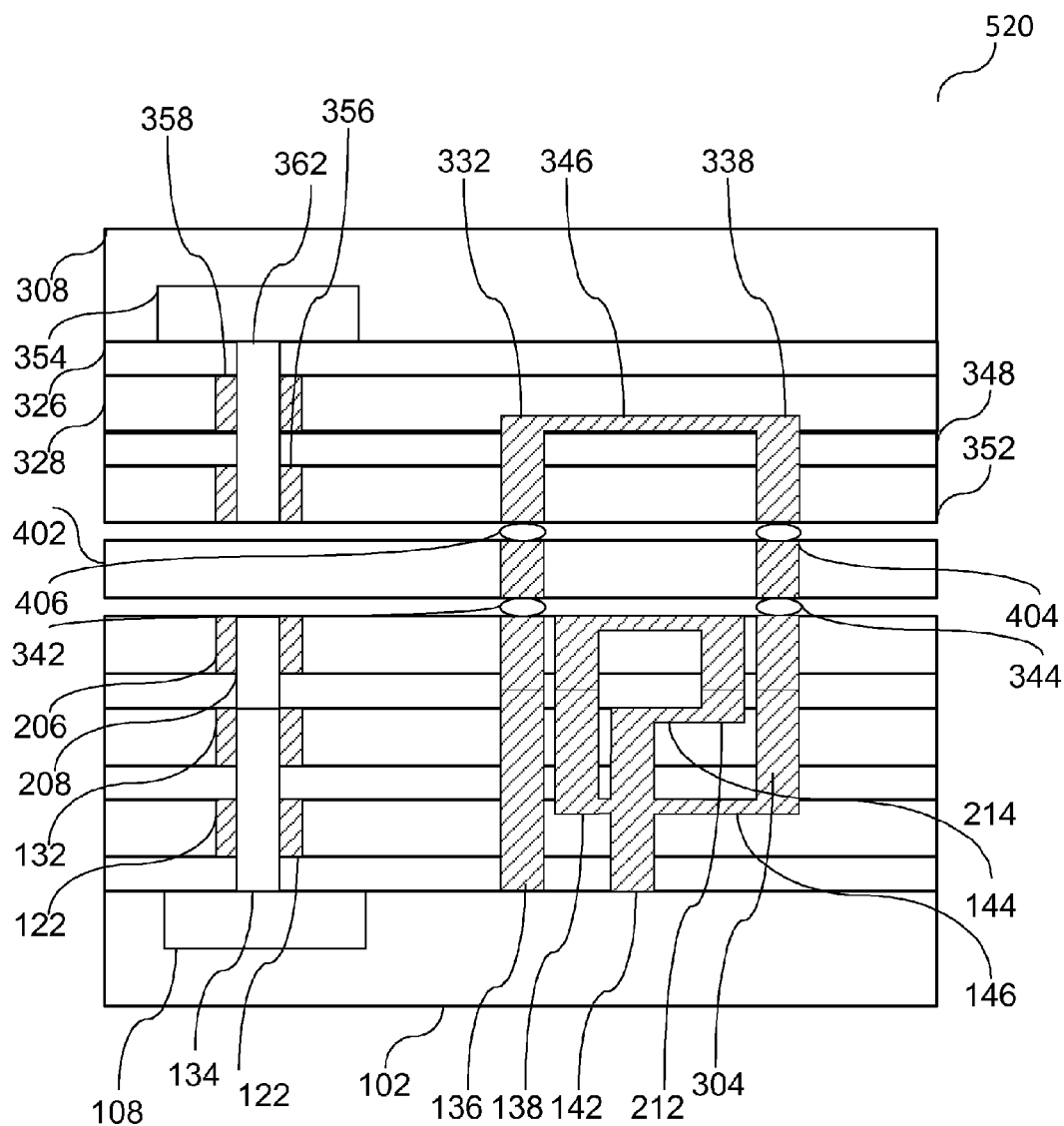

FIG. 5A and FIG. 5B show a component arrangement in accordance with a further embodiment.

In FIG. 5A and FIG. 5B, identical reference signs designate the same parts and/or the same features as were described above with reference to FIG. 1A to FIG. 1E and/or FIG. 2A to FIG. 2C and/or FIG. 3A to FIG. 3F and/or FIG. 4. Substantially only the differences between the component arrangement as illustrated in FIG. 3A to FIG. 3F and the component arrangement as illustrated in FIG. 1A to FIG. 1E and/or FIG. 2A to FIG. 2C and/or FIG. 3A to FIG. 3F and/or FIG. 4 are explained below. With regard to other features, reference is made to the above explanations concerning FIG. 1A to FIG. 1E and/or FIG. 2A to FIG. 2C and/or FIG. 3A to FIG. 3F and/or FIG. 4.

In FIG. 5A, in accordance with one embodiment in a component arrangement 510, the component arrangement 340 as shown in FIG. 3D and described above can be arranged above and electrically conductively coupled to the first component arrangement 302, as shown in FIG. 3A and described above, using the chip connections 342, 344 and the plurality of additional vias 332, 338.

In accordance with one configuration, the first additional metallization layer 328 can be electrically conductively coupled to the plurality of additional vias 136, 138, 142, 212, 304 in such a way that at least one part of the first additional metallization layer 328 forms a part of the coil. In one configuration, the first additional metallization layer 328 can be electrically conductively coupled by the plurality of additional vias 136, 138, 142, 212, 304 using the chip connections 342, 344 and at least the additional conduction structure 346 in such a way that at least one part of the first additional metallization layer 328 forms a part of the coil.

In accordance with one configuration, the chip connections 342, 344 can be formed by various conventional methods, as described above in 330. In one configuration, the chip connections 342, 344 can be formed by soldering, e.g. using a solder, for example using an electrically conductive solder, e.g. a soft solder, e.g. a diffusion solder. In another configuration, the chip connections 336, 338 can be formed by adhesive bonding, for example using an adhesive, e.g. an electrically conductive adhesive, e.g. an electrically isotropically conductive adhesive, e.g. an electrically anisotropically conductive adhesive.

In accordance with one configuration, in FIG. 5B (in 520), the component arrangement 340, as shown in FIG. 3D and described above, can be arranged above the first component arrangement 302, as shown in FIG. 3A and described above, using the interposer 402, which includes the plurality of interposer vias 404, and the plurality of chip connections 342, 344, 366, 368 and a plurality of chip connections 406.

In accordance with one configuration, the interposer 402 may include at least one from the following group of materials: silicon, glass, an electrically insulating polymer. The interposer 402 can be provided with the aid of various conventional methods, for example by silicon interposer technology.

In one configuration, as shown in 520, the interposer 402 may include the plurality of interposer vias 404, which can be formed with the aid of various conventional methods as described above with reference to FIG. 4. The plurality of interposer vias 404 can be filled with the third electrically conductive material. The third electrically conductive material may include the same third electrically conductive material as, or a different third electrically conductive material than, the third electrically conductive material of the at least one via 134 and/or of the at least one via 208 and/or of the plurality of vias 136, 138, 142, 212, 304 and/or of the plurality of through silicon vias 316, 318, 322, 324 and/or of the plurality of additional vias 332, 334, 336, 338.

In accordance with one configuration, at least the first additional metallization layer 328 can be electrically conductively coupled to the plurality of additional vias 136, 138, 142, 212, 304 in such a way that at least one part of the first additional metallization layer 328 forms a part of the coil 152.

In one configuration, the first additional metallization layer 328 can be electrically conductively coupled using the additional conduction structure 346, by the plurality of additional vias 136, 138, 142, 212, 304 using the plurality of chip connections 342, 344 and the plurality of chip connections 406 and the interposer 402, including a plurality of interposer vias 404, in such a way that at least one part of the first additional metallization layer 328 forms a part of the coil.

In accordance with one configuration, the plurality of chip connections 342, 344 and/or the plurality of chip connections 406 can be formed by various conventional methods, as described above with reference to FIG. 4.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A component arrangement comprising:
a carrier, wherein at least one electronic component is formed in the carrier;
a first metallization layer above the carrier, wherein the first metallization layer comprises a first metallic coupling structure, which is coupled to the at least one electronic component;
a second metallization layer above the first metallization layer, wherein the second metallization layer comprises a second metallic coupling structure, wherein the first metallic coupling structure is coupled to the second metallic coupling structure by at least one via;
a plurality of additional vias, which extend at least between the first metallization layer and the second metallization layer and which are electrically conductively coupled to one another in such a way that they form a coil comprising a coil region situated at an angle with respect to the main processing surface of the carrier;
a third metallization layer above the second metallization layer, wherein the third metallization layer comprises a third metallic coupling structure, wherein the second metallic coupling structure is coupled to the third metallic coupling structure by at least one via; and
wherein some of the additional vias extend at least between the first metallization layer and the third metallization layer;

wherein the coil comprises a plurality of coil turns;
wherein the at least two coil turns define the coil region;
wherein the plurality of additional vias extend at least between the first metallization layer and the second metallization layer in such a way that the coil region is situated substantially perpendicularly to the main processing surface of the carrier; and
wherein the coil comprises a coil turn, and wherein the coil turn is substantially perpendicular to the main processing surface of the carrier.

2. The component arrangement as claimed in claim 1, wherein the carrier comprises a semiconductor material.

3. The component arrangement as claimed in claim 1, wherein the first metallic coupling structure and/or the second metallic coupling structure comprise(s) a plurality of metal conductor tracks.

4. The component arrangement as claimed in claim 1, wherein the first metallic coupling structure and/or the second metallic coupling structure comprise(s) at least one of the following metals: copper, aluminum, platinum, gold, silver, palladium, nickel, or an alloy of the metals mentioned.

5. The component arrangement as claimed in claim 1, wherein the coil furthermore comprises conduction structures, which electrically couple the additional vias to one another; and
wherein the conduction structures run in the first metallization layer and/or the second metallization layer.

6. A component arrangement comprising:
a carrier, wherein at least one electronic component is formed in the carrier;
a first metallization layer above the carrier, wherein the first metallization layer comprises a first metallic coupling structure, which is coupled to the at least one electronic component;
a second metallization layer above the first metallization layer, wherein the second metallization layer comprises a second metallic coupling structure, wherein the first metallic coupling structure is coupled to the second metallic coupling structure by at least one via;
a plurality of additional vias, which extend at least between the first metallization layer and the second metallization layer and which are electrically conductively coupled to one another in such a way that they form a coil comprising a coil region situated at an angle with respect to the main processing surface of the carrier;
a third metallization layer above the second metallization layer, wherein the third metallization layer comprises a third metallic coupling structure, wherein the second metallic coupling structure is coupled to the third metallic coupling structure by at least one via; and
wherein some of the additional vias extend at least between the first metallization layer and the third metallization layer;
wherein the coil comprises a plurality of coil turns;
wherein the at least two coil turns define the coil region;
wherein the plurality of additional vias extend at least between the first metallization layer and the second metallization layer in such a way that the coil region is situated substantially perpendicularly to the main processing surface of the carrier;
at least one additional carrier;
a first additional metallization layer above the additional carrier; and
wherein the first additional metallization layer is coupled to at least some of the plurality of additional vias, such that a part of the first additional metallization layer forms a part of the coil.

7. The component arrangement as claimed in claim 6, further comprising:
a second additional metallization layer above the first additional metallization layer,
wherein the second additional metallization layer is electrically coupled to the first additional metallization layer, wherein a part of the second additional metallization layer forms a part of the coil.

8. The component arrangement as claimed in claim 6, wherein at least one additional electronic component is formed in the additional carrier.

9. The component arrangement as claimed in claim 7, further comprising:
a plurality of further additional vias, which extend at least between the first additional metallization layer and the second additional metallization layer and which form a part of the coil.

10. The component arrangement as claimed in claim 6, further comprising:
an interposer having a plurality of interposer vias;
wherein the interposer vias form a part of the coil.

11. A component arrangement comprising:
a carrier, wherein at least one electronic component is formed in the carrier;
a first metallization layer above the carrier, wherein the first metallization layer comprises a first metallic coupling structure, which is coupled to the at least one electronic component;
a second metallization layer above the first metallization layer, wherein the second metallization layer comprises a second metallic coupling structure, wherein the first metallic coupling structure is coupled to the second metallic coupling structure by at least one via;
a plurality of additional vias, which extend at least between the first metallization layer and the second metallization layer and which are electrically conductively coupled to one another in such a way that they form a coil comprising a coil region situated at an angle with respect to the main processing surface of the carrier;
a third metallization layer above the second metallization layer, wherein the third metallization layer comprises a third metallic coupling structure, wherein the second metallic coupling structure is coupled to the third metallic coupling structure by at least one via, wherein the third metallic coupling structure further comprises electrically conductive tracks which are insulated from one another by a dielectric;
wherein some of the additional vias extend at least between the first metallization layer and the third metallization layer;
wherein the coil comprises a plurality of coil turns;
wherein the at least two coil turns define the coil region;
wherein the plurality of additional vias extend at least between the first metallization layer and the second metallization layer in such a way that the coil region is situated substantially perpendicularly to the main processing surface of the carrier; and
wherein the coil comprises a coil turn, and wherein the coil turn is substantially perpendicular to the main processing surface of the carrier.

12. The component arrangement as claimed in claim 11, wherein the carrier comprises a semiconductor material.

13. The component arrangement as claimed in claim 11, wherein the first metallic coupling structure and/or the second metallic coupling structure comprise(s) a plurality of metal conductor tracks.

14. The component arrangement as claimed in claim 11, wherein the first metallic coupling structure and/or the second metallic coupling structure comprise(s) at least one of the following metals: copper, aluminum, platinum, gold, silver, palladium, nickel, or an alloy of the metals mentioned.

15. The component arrangement as claimed in claim 11, wherein the coil furthermore comprises conduction structures, which electrically couple the additional vias to one another; and
wherein the conduction structures run in the first metallization layer and/or the second metallization layer.

16. The component arrangement as claimed in claim 11, further comprising:
at least one additional carrier; and
a first additional metallization layer above the additional carrier;
wherein the first additional metallization layer is coupled to at least some of the plurality of additional vias, such that a part of the first additional metallization layer forms a part of the coil.

17. The component arrangement as claimed in claim 16, further comprising:
a second additional metallization layer above the first additional metallization layer,
wherein the second additional metallization layer is electrically coupled to the first additional metallization layer, wherein a part of the second additional metallization layer forms a part of the coil.

18. The component arrangement as claimed in claim 16, wherein at least one additional electronic component is formed in the additional carrier.

19. The component arrangement as claimed in claim 17, further comprising:
a plurality of further additional vias, which extend at least between the first additional metallization layer and the second additional metallization layer and which form a part of the coil.

20. The component arrangement as claimed in claim 11, further comprising:
an interposer having a plurality of interposer vias;
wherein the interposer vias form a part of the coil.

* * * * *